United States Patent
Chen et al.

(10) Patent No.: US 8,533,555 B2
(45) Date of Patent: *Sep. 10, 2013

(54) EFFICIENT ENCODING AND DECODING METHODS FOR REPRESENTING SCHEDULES AND PROCESSING FORWARD ERROR CORRECTION CODES

(75) Inventors: Steve Chen, Fremont, CA (US); Mark Watson, San Francisco, CA (US); Michael G. Luby, Berkeley, CA (US); Bill Seed, Los Altos, CA (US); Thomas Kunz, Fremont, CA (US)

(73) Assignee: Digital Fountain, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/205,849

(22) Filed: Aug. 9, 2011

(65) Prior Publication Data
US 2012/0036409 A1   Feb. 9, 2012

Related U.S. Application Data

(63) Continuation of application No. 11/771,750, filed on Jun. 29, 2007, now Pat. No. 8,006,160.

(60) Provisional application No. 60/806,255, filed on Jun. 29, 2006.

(51) Int. Cl.
*H03M 13/00* (2006.01)

(52) U.S. Cl.
USPC .................................................. 714/752

(58) Field of Classification Search
USPC .................................................. 714/752
See application file for complete search history.

(56) References Cited

U.S. PATENT DOCUMENTS

| | | | |
|---|---|---|---|
| 5,488,714 A | 1/1996 | Skidmore | |
| 5,727,197 A | 3/1998 | Burgess et al. | |
| 5,875,210 A | 2/1999 | Brief et al. | |
| 5,917,829 A | 6/1999 | Hertz et al. | |
| 5,975,210 A | 11/1999 | Wilkins et al. | |
| 6,243,860 B1 | 6/2001 | Holland | |

(Continued)

FOREIGN PATENT DOCUMENTS

GB 2406483 3/2005

OTHER PUBLICATIONS

International Preliminary Report on Patentability, PCT/US2007/072576—The International Bureau of WIPO—Geneva, Switzerland, Jan. 6, 2009.

(Continued)

*Primary Examiner* — Albert Decady
*Assistant Examiner* — Enam Ahmed
(74) *Attorney, Agent, or Firm* — Ryan N. Farr

(57) ABSTRACT

A sequence of symbol operations (a "schedule representation") within a data storage device, wherein the operations are those used to process encoding or decoding operations of a forward error correction code (an "FEC code") upon an arbitrary block of data of a given size (where size can be measured in numbers of symbols). The method is such that the schedule representation can be used to direct the processing of these operations upon a block of data in a way that is computationally efficient. Preferably, the same method can be applied to represent schedules derived from multiple different algorithms for the encoding or decoding of a code or for multiple different codes.

14 Claims, 6 Drawing Sheets

(56) References Cited

U.S. PATENT DOCUMENTS

| | | |
|---|---|---|
| 6,307,487 B1 | 10/2001 | Luby |
| 6,493,402 B1 | 12/2002 | Fimoff |
| 6,732,325 B1 | 5/2004 | Tash et al. |
| 6,847,760 B2 | 1/2005 | Argon et al. |
| 6,856,263 B2 | 2/2005 | Shokrollahi et al. |
| 6,909,383 B2 | 6/2005 | Shokrollahi et al. |
| 7,068,729 B2 | 6/2006 | Shokrollahi et al. |
| 7,243,285 B2 | 7/2007 | Foisy et al. |
| 7,266,155 B2 | 9/2007 | Jaffe et al. |
| 7,376,074 B2 | 5/2008 | Jung et al. |
| 7,376,813 B2 | 5/2008 | Sankaran |
| 7,418,651 B2 | 8/2008 | Luby et al. |
| 7,423,973 B2 | 9/2008 | Chen et al. |
| 8,006,160 B2 | 8/2011 | Chen et al. |
| 8,051,425 B2 * | 11/2011 | Godman et al. .............. 718/106 |
| 8,090,412 B2 * | 1/2012 | Garrett et al. .............. 455/562.1 |
| 2003/0202460 A1 | 10/2003 | Jung et al. |
| 2003/0231720 A1 | 12/2003 | Jaffe et al. |
| 2005/0203928 A1 | 9/2005 | Sankaran |
| 2005/0259584 A1 | 11/2005 | Chen et al. |
| 2006/0003795 A1 * | 1/2006 | Yamanaka et al. ......... 455/550.1 |
| 2006/0036930 A1 | 2/2006 | Luby et al. |
| 2006/0279437 A1 | 12/2006 | Luby et al. |
| 2006/0280254 A1 | 12/2006 | Luby et al. |
| 2007/0189401 A1 | 8/2007 | Watson et al. |
| 2007/0195894 A1 | 8/2007 | Shokrollahi et al. |
| 2009/0089535 A1 | 4/2009 | Lohmar et al. |

OTHER PUBLICATIONS

International Search Report, PCT/US2007/072576—International Search Authority—US, Jul. 31, 2008.

Price, R. et al.: "Signaling Compression (SigComp)," Network Working Group, pp. 1-58, IETF RFC 3320 (Jan. 2003).

Written Opinion, PCT/US2007/072576—International Search Authority—US, Jul. 31, 2008.

* cited by examiner

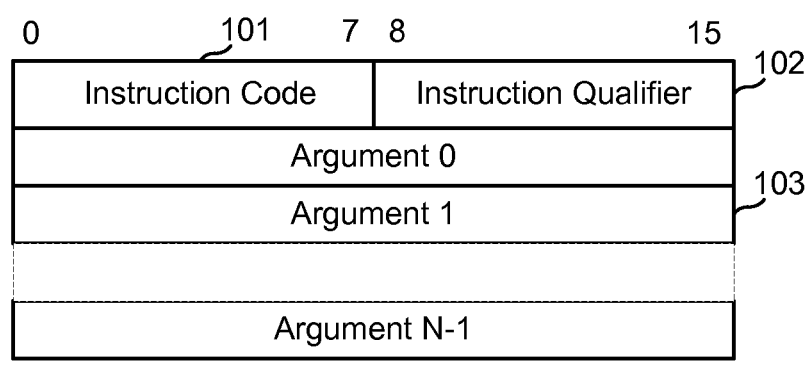
Figure 1: Instruction Format

| Instruction Code | Instruction Qualifier | Instruction Name | N | Operation |
|---|---|---|---|---|
| 0 0 0 0 0 · · · β | 0 | SYMBOL_CLEAR | 1 | $D_d[a_i] = 0$ |
| 0 0 0 0 1 s · · β | 0 | SYMBOL_COPY | 2 | $D_d[a_i] = D_s[a_i]$ |
| 0 0 0 1 0 s · · β | 0 | SYMBOL_XOR | 2 | $D_d[a_i] = D_d[a_i] \oplus D_s[a_i]$ |
| 0 0 0 1 1 · · · β | β | SYMBOL_MULTIPLY | 1 | $D_d[a_i] = \beta \cdot D_d[a_i]$ |
| 0 0 1 0 0 · · · β | 0 | SYMBOL_MULTIPLY_ALPHA | 1 | $D_d[a_i] = \alpha \cdot D_d[a_i]$ |
| 0 0 1 0 1 s · · β | β | SYMBOL_MULTIPLY_ADD | 2 | $D_d[a_i] = D_d[a_i] \oplus \beta \cdot D_s[a_i]$ |
| 0 0 1 1 0 · · · · | 0 | REG_CLEAR | 0 | $A = 0$ |
| 0 0 1 1 1 · · · β | 0 | REG_LOAD | 1 | $A = D_d[a_i]$ |
| 0 1 0 0 0 · · · β | 0 | REG_STORE | 1 | $D_d[a_i] = A$ |
| 0 1 0 0 1 · · · β | 0 | REG_XOR_FROM | 1 | $A = A \oplus D_d[a_i]$ |
| 0 1 0 1 0 · · · β | 0 | REG_XOR_TO | 1 | $D_d[a_i] = D_d[a_i] \oplus A$ |
| 0 1 0 1 1 · · · · | β | REG_MULTIPLY | 0 | $A = \beta \cdot A$ |
| 0 1 1 0 0 · · · · | 0 | REG_MULTIPLY_ALPHA | 0 | $A = \alpha \cdot A$ |
| 0 1 1 0 1 s · · β | β | REG_LOAD_MULTIPLY | 1 | $A = \beta \cdot D_d[a_i]$ |
| 0 1 1 1 0 · · · β | β | REG_MULTIPLY_ADD_FROM | 1 | $A = A \oplus \beta \cdot D_d[a_i]$ |
| 0 1 1 1 1 · · · β | β | REG_MULTIPLY_ADD_TO | 1 | $D_d[a_i] = D_d[a_i] \oplus \beta \cdot A$ |
| 1 0 0 0 0 · · · · | 0 | STOP | 0 | Stop execution |

Key:
- $A$: Symbol register
- $D_s, D_d$: Symbol arrays
- $a_i$: ith argument of the instruction
- $\alpha$: Generator element of GF(256)
- $\oplus$: Bitwise exclusive OR of symbols
- $\cdot$: Operation of a finite field element upon a symbol
- $=$: Assignment operation (value of right operand is calculated and assigned to left operand)
- $\beta$: any value (0/1)

Fig. 2

| Instruction Code | Instruction Qualifier | Instruction Name | N | Operation |
|---|---|---|---|---|
| 1 0 0 0 1 · · · d | $\alpha$ | CLEAR_LIST | $n$ | For $i = 0, \ldots, n-1$ do $D_d[a_i] := 0$ |
| 1 0 0 1 0 · · · d | $\alpha$ | SHIFT_LIST | $n$ | For $i = 0, \ldots, n-2$ do $D_d[a_i] := D_d[a_{i+1}]$ $D_d[a_{n-1}] := D_d[a_{i+1}]$ |
| 1 0 0 1 1 · · · d | $\alpha$ | ROTATE_LIST | $n$ | $A := D_d[a_0]$ For $i = 0, \ldots, n-2$ do $D_d[a_i] := D_d[a_{i+1}]$ $D_d[a_{n-1}] := A$ |
| 1 0 1 0 0 s · · d | $\alpha$ | XOR_FROM_LIST | $n$ | $A := D_d[a_0]$ For $i = 1, \ldots, n-2$ do $A := A \oplus D_s[a_i]$ $D_{d}[a_{n-1}] := A$ |
| 1 0 1 0 1 s · · d | $\alpha$ | XOR_TO_LIST | $n$ | $A := D_s[a_0]$ For $i = 1, \ldots, n-1$ do $D_d[a_i] := D_d[a_i] \oplus A$ |
| 1 0 1 1 0 s · · d | $\alpha$ | MULTIPLY_ADD_FROM_LIST | $n$ | $A := a_0 \cdot D_s[a_0]$ For $i = 1, \ldots, (n-1)/2-1$ do $A := A + a_{2i} \cdot D_s[a_{2i+1}]$ $D_d[a_{n-1}] := A$ |

Key:
- $A$: Symbol register
- $D_0, D_1$: Symbol arrays
- $\alpha$: Generator element of GF(256)
- $a_i$: $i$th argument of the instruction
- $\oplus$: Bitwise exclusive OR of symbols
- $\cdot , +$: Operation of a finite field element upon a symbol
- $:=$: Assignment operation (value of right operand is calculated and assigned to left operand)
- $\_$: any value (0/1)

Fig. 3

| Instruction Code | Instruction Qualifier | Instruction Name | N | Operation |
|---|---|---|---|---|
| 1 0 1 1 1 - - - | α | HDPC_GF2 | $3(a_r-1)+n+2$ | $A := D_i[a_i]$<br>For $i = 0, \ldots, a_r-2$ do<br>$\quad D_i[a_{i+1}] := D_i[a_{i+1}] \oplus A$<br>$\quad D_i[a_{i+1}] := D_i[a_{i+1}] \oplus A$<br>$\quad A := A \oplus D_i[a_{i+1}]$<br>$D_i[a_i] := D_i[a_i] \oplus A$<br>For $i = 3(a_r-1)+1, \ldots, 3(a_r-1)+(n-1)+1$<br>$\quad D_i[a_i] := D_i[a_i] \oplus A$ |
| 1 1 0 0 0 - - - | α | HDPC_GF256 | $3(a_r-1)+n+2$ | For $i = 0, \ldots, a_r-2$ do<br>$\quad D_i[a_{i+1}] := D_i[a_{i+1}] \oplus A$<br>$\quad D_i[a_{i+1}] := D_i[a_{i+1}] \oplus A$<br>$\quad A := \alpha A$<br>$\quad A := A \oplus D_i[a_{i+1}]$<br>For $i = 3(a_r-1)+1, \ldots, 3(a_r-1)+(n-1)+1$<br>$\quad D_i[a_i] := D_i[a_i] \oplus A$<br>$\quad A := \alpha A$ |

Key:
- $A$ — Symbol register
- $D_0, D_1$ — Symbol arrays
- $\alpha$ — Generator element of GF(256)
- $a_i$ — ith argument of the instruction
- $\oplus$ — Bitwise exclusive OR of symbols
- $\cdot$ — Operation of a finite field element upon a symbol
- $:=$ — Assignment operation (value of right operand is calculated and assigned to left operand)
- - — any value (0/1)

Fig. 4

| Instruction Code | Instruction Qualifier | Instruction Name | N | Operation |
|---|---|---|---|---|
| 1 1 0 0 1 - - ... - | n | BRANCH_PARALLEL | $2^n(n+1)$ | For i = 0, ..., n-1<br><br>Execution may begin in parallel from the instruction beginning at offset 65535$a_0$+$a_{2i+1}$ bytes from the start of the instruction list. Execution of each branch stops as soon as the instruction beginning at offset 65535$a_{2i+2}$+$a_{2i+3}$ is executed<br><br>For i = n<br><br>Execution may continue from the instruction beginning at offset 65535$a_2$+$a_{3i+1}$ bytes from the start of the instruction list once all the branches indicated above have stopped |
| 1 1 0 1 0 - - - - | 0 | GROUP_PARALLEL | 4 | Execution of all the instructions between offset 65535* $a_0$ + $a_1$ and offset 65535* $a_2$ + $a_3$ bytes from the start of the instruction list can be in parallel |

Key: $a_i$ ith argument of the instruction
     - any value (0/1)

Fig. 5

EFFICIENT ENCODING AND DECODING METHODS FOR REPRESENTING SCHEDULES AND PROCESSING FORWARD ERROR CORRECTION CODES

CROSS-REFERENCES

This application is a continuation of U.S. patent application Ser. No. 11/771,750, filed Jun. 29, 2007 now U.S. Pat. No. 8,006,160 entitled "EFFICIENT ENCODING AND DECODING METHODS FOR REPRESENTING SCHEDULES AND PROCESSING FORWARD ERROR CORRECTION CODES," which claims priority from and is a non-provisional of U.S. Provisional Patent Application No. 60/806,255 filed Jun. 29, 2006.

The following references are included here and are incorporated by reference for all purposes:

U.S. Pat. No. 6,307,487 entitled "Information Additive Code Generator and Decoder for Communication Systems" issued to Luby (hereinafter "Luby I");

U.S. Pat. No. 7,418,651 entitled "File Download and Streaming System" issued to Luby, et al., (hereinafter "Luby II");

U.S. Pat. No. 7,068,729 entitled "Multi-Stage Code Generator and Decoder for Communication Systems" issued to Shokrollahi, et al., (hereinafter "Shokrollahi I");

U.S. Pat. No. 7,721,184 entitled "Method and Apparatus for Fast Encoding of Data Symbols According to Half-Weight Codes" issued to Luby, et al., (hereinafter "Luby III");

U.S. Pat. No. 6,856,263 entitled "Systems and Processes for Decoding Chain Reaction Codes Through Inactivation" issued to Shokrollahi, et al., (hereinafter "Shokrollahi II");

U.S. Published Patent Application No. 2007/0195894 published Aug. 23, 2007 and entitled "Multiple-Field Based Code Generator and Decoder for Communications Systems" to Shokrollahi et al., (hereinafter "Shokrollahi III");

U.S. Pat. No. 6,909,383 entitled "Systematic Encoding and Decoding of Chain Reaction Codes" issued to Shokrollahi, et al., (hereinafter "Shokrollahi IV");

U.S. Published Patent Application No. 2007/0189401 published Aug. 16, 2007 and entitled "FEC Streaming with Aggregation of Concurrent Streams for FEC Computation" to Watson et al., (hereinafter "Watson")

U.S. Pat. No. 7,644,335 entitled "In-Place Transformations with Applications to Encoding and Decoding Various Classes of Codes" issued to Luby et al., (hereinafter "Luby IV"); and U.S. Pat. No. 7,676,735 entitled "Forward Error Correction (FEC) Coding and Streaming" issued to Luby et al., (hereinafter "Luby V").

FIELD OF THE INVENTION

The present invention relates to encoding and decoding data in communications systems, and more specifically to communication systems that encode and decode data to account for errors and gaps in communicated data and wherein the encoding and/or decoding use schedules to order operations.

BACKGROUND OF THE INVENTION

Transmission of files and streams between a sender and a recipient over a communications channel has been the subject of much literature. Preferably, a recipient desires to receive an exact copy of data transmitted over a channel by a sender with some level of certainty. Where the channel does not have perfect fidelity, which characterizes most physically realizable systems, one concern is how to deal with data that is lost or corrupted in transmission. Lost data (erasures) are often easier to deal with than corrupted data (errors) because the recipient cannot always recognize when the transmitted data has been corrupted. Many error-correcting codes have been developed to correct erasures and/or errors. Typically, the particular code used is chosen based on some information about the infidelities of the channel through which the data is being transmitted, and the nature of the data being transmitted. For example, where the channel is known to have long periods of infidelity, a burst error code might be best suited for that application. Where only short, infrequent errors are expected, a simple parity code might be best. It should be understood that, unless otherwise apparent or indicated, problems and solutions that are applicable to errors might also apply to erasures and vice versa. For example, an error that is a known error can be discarded and then treated identically as an erasure.

The term "communication" is used in a broad sense, and includes, but is not limited to, transmission of digital data of any form through space and/or time.

Data transmission is straightforward when a transmitter and a receiver have all of the computing power and electrical power needed for communications, and the channel between the transmitter and receiver is reliable enough to allow for relatively error-free communications. Data transmission becomes more difficult when the channel is in an adverse environment, or the transmitter and/or receiver has limited capability. In certain applications, uninterrupted error-free communication is required over long periods of time. For example, in digital television systems it is expected that transmissions will be received error-free for periods of many hours at a time. In these cases the problem of data transmission is difficult even in conditions of relatively low levels of errors.

Another scenario in which data communication is difficult is where a single transmission is directed to multiple receivers that may experience widely different conditions in terms of data loss. The conditions experienced by a given receiver may vary widely or may be relatively constant over time.

One solution is the use of forward error correcting (FEC) techniques, wherein data is coded at the transmitter in such a way that a receiver can correct transmission erasures and errors. Where feasible, a reverse channel from the receiver to the transmitter allows for the receiver to relay information about these errors to the transmitter, which can then adjust its transmission process accordingly. Often, however, a reverse channel is not available or feasible, or is available only with limited capacity. For example, in cases in which the transmitter is transmitting to a large number of receivers, the transmitter might not be able to maintain reverse channels from all the receivers. In another example, the communication channel may be storage medium. Thus data is transmitted chronologically forward through time, and unless someone invents a time travel machine that can go back in time, a reverse channel for this medium is impossible. As a result, communication protocols often need to be designed without a reverse channel or with a limited capacity reverse channel and, as such, the transmitter may have to deal with widely varying channel conditions without prior knowledge of those channel conditions.

In the case of a packet protocol used for data transport over a channel that can lose packets, a file, stream, or other block of data to be transmitted over a packet network is partitioned into equally-sized input symbols. Encoding symbols the same size as the input symbols are generated from the input symbols using an FEC code, and the encoding symbols are placed and sent in packets. The "size" of a symbol can be measured in bits, whether or not the symbol is broken into a bit stream, where a symbol has a size of M bits when the symbol is selected from an alphabet of $2^M$ symbols. In such a packet-based communication system, a packet oriented erasure FEC coding scheme might be suitable.

A file transmission is called reliable if it allows the intended recipient to recover an exact copy of the original file despite erasures in the network. A stream transmission is called reliable if it allows the intended recipient to recover an exact copy of each part of the stream in a timely manner despite erasures in the network. Both file transmission and stream transmission can instead be not entirely reliable, but somewhat reliable, in the sense that some parts of the file or stream are not recoverable or, for streaming, some parts of the stream might be recoverable but not in a timely fashion.

Protection against erasures during transport has been the subject of much study with the object of achieving reliable or somewhat reliable communication over a communication channel or network which does not itself guarantee reliable delivery of data.

Encoding and decoding of forward error correction codes designed to protect against erasures generally can generally be achieved by performing an appropriate sequence of operations amongst symbols. Many operations are known in the art which may be combined in appropriate sequences in order to obtain forward error correction codes with different properties. These operations include, but are not restricted to, simple bitwise exclusive OR (XOR) operations and operations that can be obtained from the operation of elements of a finite field upon symbols. Such operations are well-known in the art and are described in detail for example in Shokrollahi III. Other operations may be obtained by combination of simpler operations. Such operations are referred to herein as "symbol operations".

The bitwise exclusive OR operation is denoted herein by $\oplus$, that is, given two symbols A and B we denote the bitwise XOR of A and B as $A \oplus B$. A sequence of such operations is denoted herein by the symbol $\Sigma$, that is given a sequence of symbols $A_0, A_1, \ldots, A_n$ then the bitwise XOR of these symbols is denoted herein both by $A_0 \oplus A_1 \oplus \ldots \oplus A_n$ and by the notation "$\Sigma A_i$ for i=0, ..., n". The operation of a finite field element upon a symbol is denoted herein by the symbol *, that is, given a finite field element $\beta$ and a symbol C, the operation of $\beta$ upon the symbol C is denoted herein by $\beta * C$.

Examples of such codes, based on symbol operations, include simple parity codes, Reed-Solomon codes, LDGM Staircase and LDGM Triangle codes and chain reaction codes (also commonly referred to as "fountain codes") such as those described in Luby I, Shokrollahi I and Shokrollahi III.

We will use the terms "input symbols" and "output symbols" to refer to collections of symbols before and after (respectively) some sequence of symbol operations has been performed. In general, forward error correction codes are constructed from a sequence of symbol operations which transforms a collection of input symbols into a (usually larger) collection of output symbols. Such a transformation may be used as the encoding operation of a forward error correction code. A process generally exists whereby a suitable subset of the output symbols may be transformed into the input symbols by means of a further sequence of symbol operations. Such a transformation may be used as the decoding operation of a forward error correction code. In some cases, the set of output symbols includes exact copies of the input symbols, in which case the code is known as "systematic". Systematic codes have several advantages that are well known to those of skill in the art of forward error correction. Non-systematic codes may in many cases be transformed into systematic codes, for example as disclosed in Shokrollahi IV. For example, this is possible in the case that a subset of the output symbols of size equal to the set of input symbols can be identified which is suitable for performing a decoding operation. A decoding operation may thus be performed on such a set of output symbols whose values are set to the original symbols to be communicated. This operation will result in a set of input symbols which can then be mapped to a larger set of output symbols using the original transformation. The resulting larger set of output symbols will necessarily include the original symbols and thus the code is systematic.

Properties of forward error correction codes which may be of interest and which may be influenced by the choice of and sequence of symbol operations include the error correction capability of the code and the computational complexity of the code. Error correction capability is generally a determined by the construction of the code, which is often described in terms of a specific exemplary encoding algorithm or in terms of mathematical relationships between the input and output symbols of the code.

Computational complexity is a property of both the construction of the code and of a specific implementation of a code. Computational complexity might be measured by the number of atomic operations required per symbol (or per other units) in encoding and/or decoding. For example, an encoder that performs five additions per symbol encoded is less "complex" than an encoder that performs ten additions per symbol encoded. Computational complexity determinations can take into account the type of atomic operation (five multiplications might be more complex than five additions) and average complexity (doing three adds half the time and seven adds the other half of the time might be considered of equal complexity with five adds). It should be noted that a specific implementation may employ algorithms which are different from the exemplary encoding algorithm through which the code is defined yet which still result in identical outputs when provided with the same inputs as the exemplary algorithm. Many algorithms may exist which implement the same forward error correction code.

It is desirable to have an encoding/decoding process and/or an encoder/decoder that uses low computational complexity and has low memory requirements.

BRIEF SUMMARY OF THE INVENTION

According to one embodiment of the invention, a sequence of symbol operations (a "schedule representation") within a data storage device, wherein the operations are those used to process encoding or decoding operations of a forward error correction code (an "FEC code") upon an arbitrary block of data of a given size (where size can be measured in numbers of symbols). The method is such that the schedule representation can be used to direct the processing of these operations upon a block of data in a way that is computationally efficient. Preferably, the same method can be applied to represent schedules derived from multiple different algorithms for the encoding or decoding of a code or for multiple different codes.

According to another embodiment of the invention, there is provided a method of, or apparatus for, interpreting a schedule representation in order to direct the processing of the sequence of symbol operations that are used to perform an operation upon a block of data, such that interpretation of the stored schedule representation is computationally efficient.

According to a further embodiment of the invention, there is provided a method of, or apparatus for, segmenting a data block to be processed and processing each segment whilst minimizing the amount of data transferred between a fast storage resource and a slower storage resource. One implementation method comprises three steps for each segment. The first step comprises reading the segment of the data block to be processed from the slower storage resource into the fast storage resource. The second step comprises the method of processing the symbol operations on the data read into fast storage in the first step. The third step comprises writing the data that is the result of the second step from the fast storage resource to the slower storage resource. Advantageously, the first step described above for each segment may be performed concurrently with the second step for the previous segment. Similarly, the third step described above for each segment may be performed concurrently with the second step for the next segment.

In a further aspect of the above embodiment, the data block to be processed may be segmented into sufficiently small segments such that within the fast storage resource both the original segment and the processed segment may be stored concurrently. This approach admits the use of certain optimizations which further reduce computational complexity as will be further described below.

In another embodiment, there are provided methods to improve the encoding and decoding efficiency of codes which admit decoding using the method of inactivations as described in Shokrollahi II. In such decoding methods, a final step of the encoding or decoding operations comprises back-substitution of the "inactive" symbols into the "recovered" symbols. In the case that the original symbols remain available at this stage of the process, a method to reduce computational complexity through the use of these symbols is taught. Furthermore, a method to reduce the computational complexity of the back-substitution step in the general case is provided, using Hamming weights of combinations of the inactive symbols that are to be back-substituted.

In yet another embodiment, a method is provided to include information within the above mentioned schedule representation to indicate that certain sequences of symbol operations may be performed in parallel.

In a further embodiment, a method is provided to interpret such a schedule representation, processing certain sequences of operations in parallel according to the indications provided within the schedule representation.

A better understanding of the nature and the advantages of the embodiments disclosed herein may be realized by reference to the remaining portions of the specification.

BRIEF DESCRIPTION OF THE DRAWINGS

FIG. 1 is a schematic diagram of an example instruction format.

FIG. 2 is a representation of a virtual machine instruction set, as might be implemented in an encoder, decoder or other apparatus according to the present invention.

FIG. 3 is a representation of an instruction set of additional virtual machine instructions, as might be implemented in an encoder, decoder or other apparatus according to the present invention.

FIG. 4 is a representation of an instruction set of additional virtual machine instructions, as might be implemented in an encoder, decoder or other apparatus according to the present invention.

FIG. 5 is a representation of an instruction set of additional virtual machine instructions, as might be implemented in an encoder, decoder or other apparatus according to the present invention.

Figure 6:
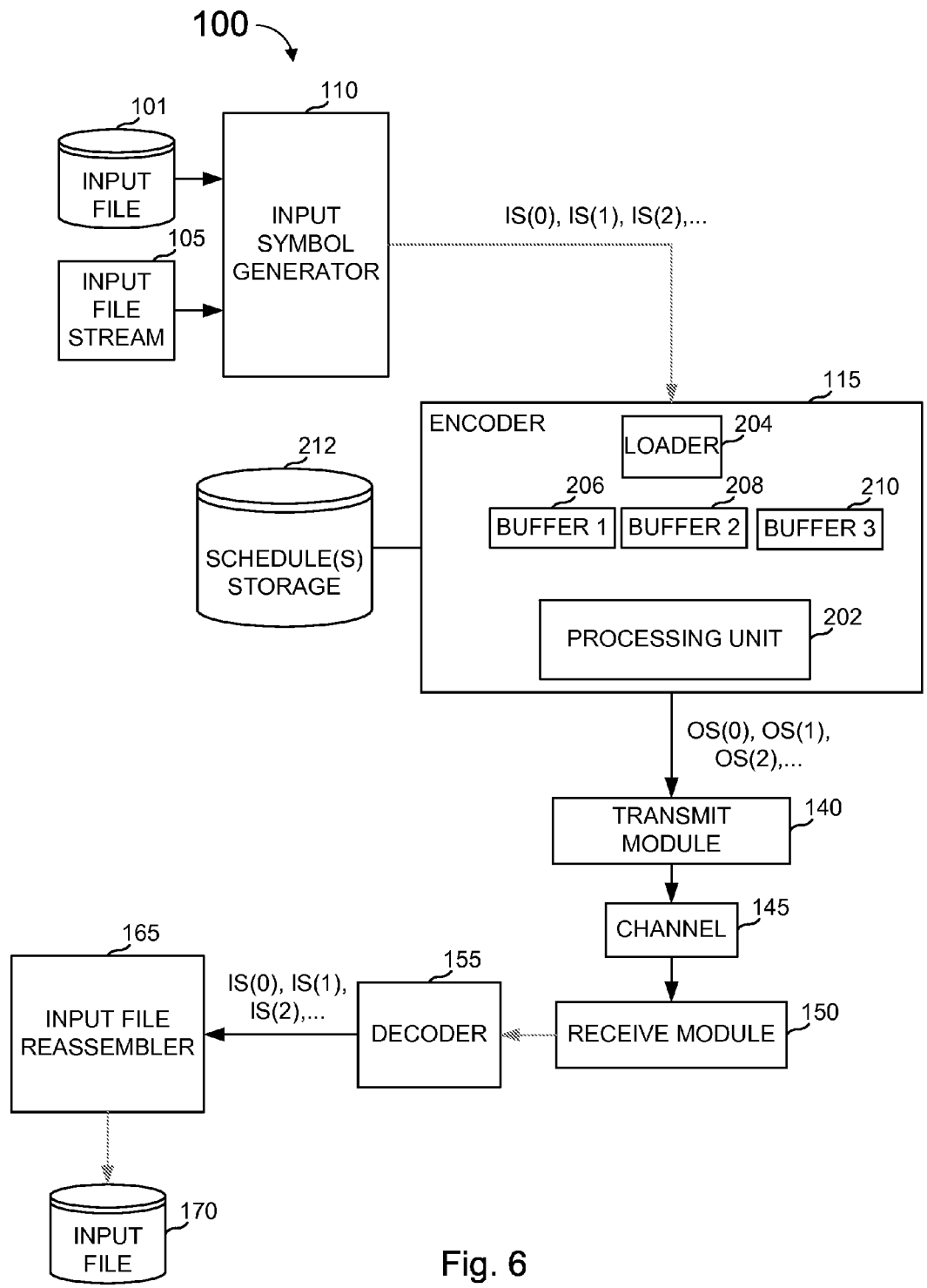
FIG. 6 is a block diagram of selected elements of a hardware implementation of a communication system within which elements of the present invention might be used.

The present application includes 31 appendices showing, among other things, values used in selected implementations of the inventions described herein. The use of the data in those appendices in apparatus and/or methods described herein is explained further as part of the detailed description of specific embodiments. The Appendices are organized with Appendix A comprising 30 appendices and an Appendix B. Appendix A sets forth an appendix of pre-coding values and an appendix of repair symbol encoding values for a particular implementation of an encoder, for each of 15 different block sizes. Appendix B sets forth a header file that specifies values for another particular implementation of an encoder, for various block sizes.

DETAILED DESCRIPTION OF SPECIFIC EMBODIMENTS

It is to be understood that the various functional blocks described herein may be implemented by a combination of hardware and/or software, and that in specific implementations some or all of the functionality of some of the blocks may be combined. Similarly, it is also to be understood that the various methods described herein may be implemented by a combination of hardware and/or software. Thus, where a computational step is performed, which might be described as "we then do step X", it should be understood that such descriptions include electronic hardware and/or software, or the like, performing those steps, typically as part of a communications process and not involving human or manual interaction.

In a specific preferred embodiment of this invention, the symbol operations that are considered are the bit-wise Exclusive OR (XOR) of a first and second symbol to produce a third symbol and the operation of an element of the finite field $GF(2^8)$ upon a first symbol to produce a second symbol. There are various ways in which the operation of an element of a finite field upon a symbol may be defined, which are well-known in the art and some of which are described in detail in Shokrollahi III.

Computational complexity is a major issue when designing systems that incorporate forward error correction codes. Often such systems include elements that are constrained in terms of computational resources, for example, mobile, handheld or battery powered devices and consumer electronics equipment such as set top boxes used in the delivery of television services. Equally, a device may have large computational resources but may be required to perform many encoding operations concurrently or over a short period of time, for example a head end server which is distributing television services to many receivers over a network. In this case the complexity of the code directly influences the capacity of the device in terms of the number of services which can be concurrently supported. Thus there is considerable advantage in reducing the computational complexity of forward error correction codes since this reduces the computational resources which must be provided within such devices and thus reduces their cost or increases their capacity.

In many cases, the task of encoding or decoding a forward error correction code can be divided into two steps of scheduling and performing. The first step comprises of determining the sequence of symbol operations that are used to perform the encoding or decoding operation, without performing these symbol operations upon the data to be encoded or decoded. The second step comprises performing the sequence of symbol operations. Depending on the properties of the particular forward error correction code and other factors, such as the size of the block of data to be encoded or decoded and the size of the symbols into which it is segmented, the first step may be more computationally complex than the second or the second step may be more computationally complex than the first or the two steps may have similar computational complexity.

In many cases, a device may need to perform the same sequence of symbol operations many times upon different blocks of data. For example, the sequence of operations used to encode a data block of a particular size according to a particular forward error correction code does not generally change when the data to be encoded changes. In many cases, an encoder is used to encode many blocks of data that are the same size, for example in the case of streaming services in which the stream is segmented into blocks of equal size or in which many streams must be processed, each of which has blocks of equal size. In the case of a file delivery service where the file is segmented into blocks of equal size, similar issues arise. Watson describes methods and apparatus for transforming blocks of varying length, such as might also be encountered in streaming applications, into blocks of equal size for FEC purposes and here again the sequence of symbol operations may be the same for every block.

Another example of a situation where a device may need to perform the same sequence of symbol operations many times upon different blocks of data is the case of a device that has multiple types of volatile or non-volatile information storage capability which may have different access speeds. This occurs in the case of most modern CPUs, which have a certain amount of volatile memory available on the same integrated circuit as the CPU itself Access to this "on-chip" memory is significantly faster than access to externally located memory. In some systems, the usage of this on-chip memory is controlled entirely by the system hardware and is used to temporarily "cache" data from the main memory. In other systems, software control of the use of this memory is available through the use of appropriate program instructions ("Direct Memory Access"). Another example is the case in which there are two or more kinds of "off-chip" volatile or non-volatile data storage with different properties, for example memory with fast access times and, potentially larger, storage devices with slower access times such as FLASH memory or hard disk drives.

In such cases, it is desirable to perform the symbol operations on data located within the type of data storage with the fastest access time. However, a block of data which is to be processed by a forward error correction encoding or decoding algorithm may be larger than will fit into the type of data storage with the fastest access time. One approach in these cases is to segment the data into multiple smaller blocks, or "subblocks", each able to fit within the type of data storage with the fastest access time. This can be done in such a way that the sequence of symbol operations to be performed on each subblock is the same. For example, each symbol may be divided into some number, n, of subsymbols (possibly, but not necessarily, of the same size) and a first subblock constructed as the collection of the first subsymbol of each symbol, a second subblock constructed as the collection of the second subsymbol of each symbol, etc.

In cases such as those described above, where the same sequence of symbol operations is to be performed many times, it is clearly advantageous to perform the first step of the encoding or decoding operation, that of determining the sequence of symbol operations which are used, only once. This sequence may then be stored and re-used many times, reducing the computational complexity of the code to that of the second step, performing the symbol operations, alone. In some cases, the sequence may be determined during the design of the device and stored permanently in some form of storage available to the device. In other cases, the sequence may be determined dynamically and stored temporarily for reuse, for example, for all the subblocks of a single data block.

In cases where the sequence of operations depends only on the size of the data block (in symbols), then the sequences may be pre-computed for some or all of the possible block size and stored on a permanent, semi-permanent or temporary basis for reuse when a block of that size is to be processed. An important problem, therefore, is how to represent the results of this first step in storage in a manner which allows the second stage of encoding or decoding to be performed with minimum computational complexity. In particular, it is desirable to minimize the amount of processing to interpret the stored sequence of operations so that as much of the available computational resources as possible can be applied to the task of performing the symbol operations. We will call a particular sequence of symbol operations a "schedule" and thus what is required is a method of representing a schedule within a data storage device, said method having the properties mentioned above. Examples of schedules are shown in the Appendices.

As is well known, many different algorithms may exist for performing the encoding and decoding operations for a given forward error correction code. These algorithms may have very different properties in terms of both computational complexity and storage requirements. Often there are many trade-offs which can be made between complexity and storage, i.e., algorithms can be devised which have lower computational complexity at a cost of a greater storage requirement or vice versa. Additionally, new algorithms may be discovered. A desirable property of a method of representing a schedule is therefore that it is not specific to any particular algorithm. A further desirable property is the ability to use potentially large amounts of computational resources to derive a schedule representation which is particularly efficient, or even optimal, for achieving the symbol transformation. Thus, what is desired is a method for representing a schedule such that the method can represent schedules for alternative algorithms without having to modify either the method of representation of the schedule or the systems which perform the symbol operations according to the schedule representation. What is also desired is an efficient method for using the method of representing a schedule to direct the processing the symbols operations on a data block according to a schedule representation.

FECvms and Schedule Representations

A representation of a schedule may be constructed in the form of a sequence of "instructions" or "commands" that are to be processed by a "virtual machine" designed specifically for the purpose of performing sequences of symbol operations. To achieve this, a "virtual machine language" is defined in which the instructions can be expressed. The concepts of "virtual machines" and "virtual machine languages" are well known in the art of computer programming. For example, in association with the Java programming language, a specific virtual machine and virtual machine language are defined in the language standard. Advantageously, the virtual machine approach allows the instruction sequence to be defined in a platform independent manner, such that execution of the sequence of instructions is possible on multiple distinct platforms without recompilation or other modification of the instruction sequence. However, unless otherwise indicated, the present invention is not limited to virtual machine implementations.

The concept of a virtual machine and virtual machine language which is specialized for a particular task is also well-known, for example in the SIGCOMP standard (IETF RFC3320, www.ietf.org) in which such a language is used to communicate the procedures for decompression of packets of compressed data between systems.

A "virtual machine language" described herein and hereinafter referred to as a "schedule representation" is specialized for the task of representing sequences of symbol operations for the purpose of forward error correction encoding and decoding in a manner which is computationally efficient to interpret. The schedule representations have further features which make them especially suitable for the task of representing sequences of symbol operations for the purpose of forward error correction encoding and decoding. In particular, advantageously, schedule representations have been designed to facilitate extremely fast interpretation by an appropriately designed "virtual machine", hereinafter referred to as a FECvm. As noted above, in many applications it is necessary to process the encoding or decoding operation many times upon different blocks of data. In such cases, the logic used to interpret a schedule representation is also processed many times. Therefore, reductions in this logic have a multiplicative benefit. One simplification is the use of a schedule representation that includes only instructions that direct the performance of specific symbol operations. In particular, there may not be any instructions provided to perform operations that are not symbol operations or that perform conditional, branching looping or other transfer of control operations. As a result, during the interpretation of the schedule representation, the amount of processing time spent performing symbol operations is maximized whilst the amount of processing time spent on other kinds of operation is minimized.

Another simplification is to have, as well as simple atomic instructions, a number of "compound" instructions, which perform a sequence of two or more symbol operations. These compound instructions facilitate efficient representation of certain sequences of operations that are commonly used for the purpose of encoding and decoding forward error correction codes, without introducing aspects that are specific to particular codes.

The use of compound instructions also reduces the amount of data storage used to store a schedule representation. Further, "specialized compound instructions" can be provided for a compact representation of certain large sequences of symbol operations that are used in the encoding and decoding procedures for particular forward error correction codes, for example those described in Luby I, Shokrollahi I, and Shokrollahi III.

Reducing the size of the data storage used to store the schedule representation has several advantages, some of which are described below. The cost associated with storage itself is thus reduced. In the cases described above where there are several kinds of volatile or non-volatile data storage capability available with different access speeds and capacities, it is generally desirable to store a schedule representation within a storage capability with a faster access time. Often, such a fast storage capability will have a small capacity. Since the schedule representation must generally be processed many times, it is advantageous if it can be held completely within this fast storage capability since otherwise at least some of it will need to be read from a slower storage capability each time it is processed.

In a preferred embodiment, a FECvm may operate with three storage areas for data symbols: a symbol register, A, and two data stores, $D_0$ and $D_1$. The symbol register is preferably sized to hold a single symbol of data. The data store $D_0$ holds a number, $N_0$, of symbols, which are denoted $D_0[0]$, $D_0[1]$, . . . , $D_0[N_0-1]$. The data store $D_1$ holds a number, $N_1$, of symbols, which are denoted $D_1[0]$, $D_1[1]$, . . . , $D_1[N_1-1]$.

FIG. 1 illustrates a possible instruction format. This comprises an 8-bit Instruction Code 101, which determines the instruction to be performed, an 8-bit qualifier field 102, which modifies the operation of the instruction and zero or more 16-bit argument fields 103. The number of argument fields, N, is determined from the Instruction Code and Instruction Qualifier in a manner which is specific to the particular Instruction Code. Other variations are possible.

FIG. 2 is an illustration of a possible instruction set of a schedule representation in one specific embodiment, including details of how the number of argument fields, N, is derived for each instruction and the sequence of operations that are performed to process the instruction.

In this embodiment, instructions are provided for symbol operations involving the finite field GF(256). Interpretation of these instructions assumes an FECvm or its equivalent has been designed to handle a number of aspects related to the symbol operations involving finite field elements, including the exact manner in which a finite field element operates on a symbol, the manner in which a finite field element can be represented as an 8-bit field and a particular generator element for the finite field, denoted herein as "alpha". Suitable choices are well-known and are described, for example, in Shokrollahi III.

In some embodiments, these finite field aspects are intrinsic to a schedule representation i.e. they are fixed at the time a schedule representation is designed. Advantageously, this approach permits optimizations to be made based on the particular choice of field representation, the operation of field elements on symbols and the chosen generator element, alpha. In particular, the generator element alpha and the operation of finite field elements upon symbols can advantageously be chosen such that the operation of the particular element alpha upon a symbol can be performed very efficiently. In other embodiments, some of these aspects, in particular the irreducible polynomial and chosen field generator alpha, need not be defined in advance and may be included as configuration parameters within the schedule representation (as will be described further below).

As will be clear to those of skill in the art upon review of this disclosure, the systems presented herein are not restricted to working with the field GF(256) and similar instructions could be defined for any finite field for which an operation of finite field elements upon symbols can be defined. For example, the instruction SYMBOL_XOR shown in FIG. 2 can operate over the field GF(2), as well as over the field GF(256), if the appropriate field representation is used, as one skilled in the art will recognize. Thus, even though some instructions in FIG. 2 are specific to the field GF(256), other instructions are more flexible and may be used to operate over other fields. For example, with respect to the instructions of FIG. 2, one may have a schedule representation for encoding an FEC code that operates over the field GF(2), one may have another schedule representation for decoding an FEC code that operates over the field GF(256), and one may have another schedule representation for encoding an FEC code that operates partially over the field GF(2) and partially over the field GF(256).

Furthermore, additional instructions could be added to the set provided here for the purpose of implementing additional symbol operations howsoever defined.

A schedule representation may comprise two blocks of data. The first block, referred to herein as a header block, comprises certain parameters used to interpret a second data block. The second data block comprises instructions that are to be interpreted by a FECvm or its equivalent. A straightforward list of instructions may be provided, each following immediately after the previous one. The last instruction in the list may be the Stop instruction, which indicates that execution of the schedule should stop.

The header block comprises information used by a FECvm or its equivalent to process the instructions in the instruction list. Examples, of header block information include the irreducible polynomial that defines the field representation and the chosen generator element, alpha. In a preferred embodiment described herein, however, these aspects are considered fixed and built into a FECvm or its equivalent that interprets such a schedule representation. Thus the header block may be empty.

Incremental Processing

An important aspect of data processing on many systems is controlling the allocation of computational tasks between processes. The methods described here can in some cases consume a significant proportion of the computational resources of the device. It is thus advantageous to be able to perform encoding and decoding operations in an incremental fashion, so that the decoding or encoding operation can be stopped for some period of time whilst other tasks are performed. For example, an incremental approach might involve performing a specific percentage of a given encoding or decoding task before allowing other tasks to process after which processing will return to the FEC encoding or decoding task.

It is not always the case that a given proportion of the instruction list represents the same proportion of the encoding or decoding work. Accordingly, some variations may include a method to specify portions of the instruction list that correspond to specific proportions of the encoding or decoding task. This might be done by including within the header a schedule representation some indications of how much computation is required to process different portions of the schedule representation. For example, there may be a list of pairs of the form (a,b) included in the header of a schedule representation, where b is a byte offset into the schedule representation such that processing of the instructions in the schedule representation previous to b would use a symbol operations. As examples of variants, the value of a may be expressed as a fraction of the total number of symbol operations in the schedule representation, or in terms of weighted symbol operations if some operations are more computationally intensive than others, or in some other unit of measure.

Schedule Representation Notation

A notation is described with which schedule representation instructions may be written in human-readable form. This notation is defined as follows, using Augmented Backus Naur Form (ABNF):

```
<Schedule Representation Program> ::= *(<Schedule Representation
Instruction>)
<Schedule Representation Instruction>
    ::= <InstructionName> [<BlockQual>] [ "Qual = " <Qual>]
["Args = " <ArgList>]
<InstructionName> ::= 1*(ALPHA | "_")
<BlockQual> ::= "{" 1*3<srcdst> "}"
<srcdst> ::= "s = 0" | "s = 1" | "t = 0" | "t = 1" | "d = 0" | "d = 1"
<Qual> ::= 1*3DIGIT
<ArgList> ::= 1* ( 1*5DIGIT )
```

In this notation, the <InstructionName> element may be the instruction name from FIG. 2. The <BlockQual> element may be included if the instruction includes one or more 's', 't' or 'd' bits which indicate the source and/or destination blocks for the operation. Whether a source, destination or both are specified is dependent on the instruction. For example each of the instructions included in FIGS. 2-5 includes zero, one two or three of these indications. The <Qual> element specifies the value of the Instruction Qualifier field in decimal. Whether an Instruction Qualifier is required and its interpretation depends on the particular instruction. The <ArgList> element lists the arguments of the instruction in decimal. The number of arguments in the argument list and their interpretation depends on the particular instruction and in some cases on the instruction qualifier. Elements in this notation are separated by whitespace. Other variations are possible, providing similar functionality.

The schedule representation notation described above can be used to represent the sequence of symbol operations, or schedule, used for a very wide variety of forward error correction codes, including Parity Codes, Hamming codes, LDGM Staircase and Triangle codes, Reed-Solomon codes, chain reaction codes such as those described in Luby I, Shokrollahi I, Shokrollahi III, Watson and combinations thereof.

Encoding and Decoding of Forward Error Correction Codes

The technique described herein is further illustrated by reference to a generalized matrix description of certain forward error correction codes, including those described in Shokrollahi I and Shokrollahi III in which columns of the matrix correspond to "intermediate symbols" and rows of the matrix correspond to "source," "repair," and "static" symbols.

Let $S[0], \ldots, S[K-1]$ denote the source symbols, $R[0], \ldots, R[r-1]$ denote the repair symbols and let $C[0], \ldots, C[L-1]$ denote the intermediate symbols.

The entries of such a matrix may be taken from a finite field $GF(2^q)$, although in some regions of the matrix, the choice of elements may be restricted to those in the image of some smaller finite field, $GF(2^p)$ for $p<q$ according to some embedding of $GF(2^p) \rightarrow GF(2^q)$, such as is the case for some of the FEC codes described in Shokrollahi III.

This matrix expresses the relationships between source symbols and repair symbols, via the intermediate symbols, in the following way:

(1) There are source rows with one matrix row for each source symbol, which expresses that source symbol as a linear combination of the intermediate symbols; specifically, if the elements of the matrix row for source symbol i are denoted $a_{i0}, \ldots, a_{iL-1}$ then we have $S[i] = \Sigma a_{ij} * C[j]$ for $j=0, \ldots, L-1$.

(2) There are repair rows with one matrix row for each repair symbol, which expresses that repair symbol as a linear combination of the intermediate symbols; specifically, if the elements of the matrix row for repair symbol i are denoted $b_{i0}, \ldots, b_{iL-1}$ then we have $R[i] = \Sigma b_{ij} * C[j]$ for $j=0, \ldots, L-1$. (3) There are zero or more static rows, each of which identifies a linear combination of the intermediate symbols which is constrained to be equal to the zero symbol; specifically, if the elements of the matrix row for static symbol i are denoted $c_{i0}, \ldots, c_{iL-1}$ then we have $0 = \Sigma b_{ij} * C[j]$ for $j=0, \ldots, L-1$, where 0 denotes the zero symbol (i.e., the symbol whose M bits are all zero).

The combination of source rows and static rows form an invertible matrix.

Encoding may be performed by constructing the matrix comprising the rows corresponding to the static symbols and the source symbols and finding its inverse (for example, by Gaussian elimination). This inverse matrix provides a direct expression for each intermediate symbol in terms of the source symbols. This matrix can be used to calculate the intermediate symbols from the source symbols. Repair symbols may then be constructed as linear combinations of the intermediate symbols as indicated by the original matrix rows corresponding to the repair symbols.

Decoding can be performed by constructing the matrix comprising the rows corresponding to the static symbols and all received symbols (source and repair). If this matrix is of full rank, then a subset of the rows can be identified which form an invertible matrix (for example by Gaussian elimination). The inverse of the matrix formed from these rows provides a direct expression for each intermediate symbol in terms of the received symbols which allows all the intermediate symbols to be recovered. The missing source symbols can then be constructed as the appropriate linear combinations of intermediate symbols as indicated by the original matrix rows corresponding to the source symbols.

Simple Encoding and Decoding Using Matrix Multiplication

For some FEC codes, part of the encoding and/or decoding algorithm involves multiplying a matrix by a vector of symbols. For example, let M by an m×k matrix with entries from GF(256), and let S[0], . . . , S[k-1] be symbols which are to be multiplied by M and let C[0], . . . , C[m-1] be the symbols that are the result of the multiplication. Suppose S[0], . . . , S[k-1] are originally stored in the data store $D_0$ and the result of the multiplication is to be stored in $D_1$, where $D_1$ is initialized so that all symbols there are all zeroes. Then, a schedule representation for this process comprises, for each non-zero entry A at position (i,j) in M, an instruction (written in ABNF human-readable form as described earlier, that corresponds to the SYMBOL_MULTIPLY_ADD instruction of FIG. 2) of the following form:

SYMBOL_MULTIPLY_ADD    s=0    d=1
   Qual=<A>Args=<i><j>

When written in the format described in FIG. 2, the 8-bit Instruction Code is "00101001", the 8-bit qualifier is the 8-bit representation of the finite field element A, and the two 16-bit arguments are the binary representations of i and j. Since s=0 and d=1, instructions of this form operate on symbols in the data store $D_0$ and store the result in the data store $D_1$.

Other embodiments of the schedule representation of the matrix multiplication process are also possible, including scheduling representations based on the processes described in Luby IV. For example only one data store could be used to perform an in-place transformation of the symbols, i.e., S[0], . . . , S[k-1] are loaded into the data store before the instruction list is executed, and after the instruction list is executed then the result symbols C[0], . . . , C[m-1] are stored in the data store, at least partially overwriting the values of S[0], . . . , S[k-1]. Furthermore, as will be clear to those of skill in the art upon review of this disclosure the above method is not restricted to matrices whose elements are taken from GF(256) but may also be applied to matrices whose elements are taken from GF(2) or more generally from more than one different finite field.

Encoding and Decoding Using Gaussian Elimination

Many erasure codes, including Reed-Solomon and some of those in Shokrollahi I, Shokrollahi II, Shokrollahi III and Shokrollahi IV can be decoded at least in part using Gaussian Elimination. Furthermore, some erasure codes, including some of those in Shokrollahi III and Shokrollahi IV can be encoded in part using Gaussian Elimination. In a standard Gaussian Elimination process, the rows and columns of the matrix are considered to either be unprocessed or processed. At the start of the process, all the rows and columns are considered to be unprocessed. At each stage of the process, a non-zero pivot element is chosen from among the elements that are in an unprocessed row and an unprocessed column. The row containing the pivot element is known as the pivot row, $P_R$, and the column containing the pivot element is known as the pivot column, $P_C$. Then, for each processed column, Y, that has a non-zero element, B, in the pivot row, we identify the processed row $P_{RY}$ that was the pivot row at the step in which Y was chosen as pivot column, and for each such Y we perform the following row operation. Let A be the element at the intersection of Y and $P_{RY}$. Then the result of multiplying row $P_{RY}$ by $-BA^{-1}$ is added to the pivot row $P_R$. This last step is referred to as a "row operation" and can be expressed as shown in Equation 1. Once the above process has been done for each such Y, the pivot row $P_R$ and the pivot column $P_C$ are marked as processed.

$$\text{RowOp}[P_{RY}, P_R, -BA^{-1}] \qquad (\text{Equ. 1})$$

The resulting matrix may then be operated on by row and column exchanges such that the pivot elements lie on the diagonal in the order in which they were chosen as pivot elements. The above process will transform the matrix into upper triangular form. Let $I_1$ be the number of steps of the Gaussian Elimination process that have been performed, and thus at the end of the above process $I_1$ is equal to the number of columns of the matrix (assuming it has full rank). Let $P_R[i]$ and $P_C[i]$ denote the row that was chosen as pivot row and the column that was chosen as pivot column at step i for $0<=i<I_1$ respectively. The Gaussian Elimination process may be continued through a further $I_1$ steps as follows: In each step, i, $I_1<=i<2I_1$, let $j=2I_1-i$, and then for each column Y not equal to column $P_C[j]$ that contains a non-zero element in row $P_R[j]$, we identify the row $P_{RY}$ which was the pivot row in the step in which Y was the pivot column and perform the row operation shown in Equation 2.

$$\text{RowOp}[P_{RY}, P_R[j], -BA^{-1}]$$

In Equation 2, B is the element in row $P_R[j]$, and column Y, and A is the element in row $P_{RY}$ and column Y. The above process would complete the transformation of the matrix into a diagonal matrix. The matrix may be further transformed into the identity matrix by multiplying each row by the inverse of the single non-zero element in that row.

As is well-known to those of skill in the art of the encoding and decoding of forward error correction codes, many encoding and decoding methods which allow additional efficiencies and advantages can nevertheless be expressed in the language of the above general method. For example, the well-known method of belief propagation can be expressed in the language of the above general method in which each pivot row contains a single non-zero unprocessed element at the point at which it is chosen. The method of encoding and decoding by inactivations presented in Shokrollahi II can also be expressed in the language of the above general method as illustrated further below. The method presented here for generation of a representation of the sequence of symbol operations is not dependent on any aspects of the method of selection of pivot rows and columns or other restrictions or qualifications that may be placed upon the general process above and can therefore be applied in a wide variety of cases even though the method of decoding may not include the full generality of a Gaussian Elimination method described above.

The process of encoding or decoding is realized by repeating the sequence of row operations (in the same order as used to transform the original matrix to the identity matrix) on the symbols of the code, i.e., for each row operation (shown in Equation 1), the decoder adds the result of multiplying symbol $P_{RY}$ by $-BA^{-1}$ to symbol $P_R$.

In a preferred embodiment of the invention described herein, there is provided a method of representing a sequence of symbol operations using an instruction list that corresponds to row operations using Gaussian Elimination as described above, the instruction list comprising, for each row operation RowOp[$P_{RY}$,$P_R$, $-BA^{-1}$] (as shown in Equation 1), an instruction (written in ABNF human-readable form as described earlier, that corresponds to the SYMBOL_MULTIPLY_ADD instruction of FIG. 2) of the following form:

SYMBOL_MULTIPLY_ADD s=1 d=1 Qual=<-$BA^{-1}$>Args=<$P_R$><$P_{RY}$>

When written in the format described in FIG. 2, the 8-bit Instruction Code is "00101101", the 8-bit qualifier is the 8-bit representation of the finite field element $-BA^{-1}$, and the two 16-bit arguments are the binary representations of $P_R$ and $P_{RY}$. Since s=1 and d=1, instructions of this form operate on symbols in the data store $D_1$ and the data store $D_0$ is not used.

In this embodiment, the data store $D_0$ is not used and the symbols to be decoded are loaded into $D_1$ before the instruction list is processed.

In a further embodiment, the field is GF(2) and the process above is replaced by one in which the instruction list comprises instructions (written in ABNF human-readable form as described earlier, that corresponds to the SYMBOL_XOR instruction of FIG. 2) as follows:

SYMBOL_XOR s=1 d=1 Args=<$P_R$><$P_{RY}$>

When written in the format described in FIG. 2, the 8-bit Instruction Code is "00010101".

An advantage of the above described method is that an implementation of a FECvm or its equivalent is extremely simple. Furthermore, for the purpose of encoding, where a small set of specific block sizes is used, the approach described here may permit simple hardware implementation of the encoding process.

Encoding and Decoding Using Inactivations

Encoding and decoding using inactivations can be done as described in Shokrollahi II, and can be considered in part as including the above Gaussian Elimination process with the following approach for choosing the pivot element:

(rule 1) if there is an unprocessed row with exactly one non-zero element in an unprocessed column, then this element is chosen as the pivot element.

(rule 2) if there is no such row, then if there is an unprocessed column with no non-zero elements within the processed rows and at least one non-zero element in the unprocessed rows, then a non-zero element in this column is chosen as the pivot element.

(rule 3) if there is no such row or column, then any non-zero element that is in an unprocessed row and an unprocessed column is chosen as the pivot element.

In this process, each matrix column is considered as either "recovered" or "inactive" according to the following rules: the first pivot column that is chosen according to the operation of rule (3) and all subsequently chosen pivot columns are denoted as "inactive". The remaining pivot columns (which are chosen before this point) are denoted "recovered".

In a further embodiment, a schedule representation is provided with additional instructions as shown in FIG. 3. There is further provided a method of representing a sequence of symbol operations corresponding to encoding and decoding using inactivations as described above as follows: We assume in the description below that the output symbols are stored in the symbol array, $D_0$, of a FECvm interpreting a schedule representation and the intermediate symbols will be stored in the symbol array, $D_1$.

We consider the operation of the encoding and decoding using inactivations process in stages as follows: In the first stage, the rules (1) and (2) are applied to determine pivot elements. Thus, the first stage ends when rules (1) and (2) can no longer be applied and rule (3) must be applied. At each step i in this first stage, we denote by $P_R[i]$ and $P_C[i]$ the chosen pivot row and column respectively and we denote by R[i] the set of row operations that are performed during this step of the Gaussian Elimination process (i.e., all row operations of the form RowOp[X, $P_R[i]$, beta] for any X and beta). Let X[i] be the set of rows, $P_{RY}$, such that RowOp[$P_{RY}$, $P_R[i]$, beta] is an element of R[i] and write $X_{i,0}, \ldots, X_{i,n[i]-1}$ for the elements of X[i], where n[i] is the number of elements of X[i]. Note that this process is such that these values will be distinct. In a preferred embodiment, we consider matrices of such a form that beta is the identity in all the row operations in R[i].

A schedule representation comprises a single instruction (shown in ABNF machine-readable format, corresponding to the XOR_FROM_LIST instruction shown in FIG. 3) for each step of this first stage of encoding and decoding using inactivations as follows:

XOR_FROM_LIST s=0 t=1 d=1 Qual=<n[i]+1>Args=<O($P_R[i]$)><$X_{i,0}$><$X_{i,1}$> ... <$X_{i,n[i]-1}$><$P_R[i]$> where O($P_R[i]$) denotes the position in the data store $D_0$ of the original symbol associated with $P_R[i]$.

In a second stage, we consider the pivot rows considered in the remaining steps of the Gaussian Elimination process. We continue with the notation above, wherein R[i] denotes the set of row operations performed during step i in the Gaussian Elimination process. Let $I_0$ denote the value of i at the first step of this second stage and let $I_1$ denote the number of columns in the matrix. Therefore steps $0, \ldots, I_0-1$ comprise the first stage and steps $I_0, \ldots, I_1-1$ comprise the second stage. In this second stage, let X[i] be the set of rows X such that RowOp[X, $P_R[i]$, beta] is an element of R[i] and X is one of the pivot rows considered in the first stage (i.e., X=$P_R[i]$ for some i, $0<=i<I_0$.) Again, in a preferred embodiment, we consider matrices in which beta is the identity in all the row operations in R[i]. We denote the elements of X[i] by $X_{i,0}, \ldots, X_{i,n[i]-1}$ as above and the schedule representation further comprises the following instruction (corresponding to the XOR_FROM_LIST instruction shown in FIG. 3):

XOR_FROM_LIST s=0 t=1 d=1 Qual=<n[i]+1> Args=<$X_{i,0}$><$X_{i,1}$> ... <$X_{i,n[i]-1}$><$P_R[i]$>

In a third stage, we reconsider the same pivot rows as in the second stage. For each such row $P_R[i]$, let X'[i] be the set of rows X such that RowOp[X, $P_R[i]$, beta] is an element of R[i] and X is one of the previously considered rows which was not considered in the first stage. Again, in a preferred embodiment, we consider matrices in which beta is the identity in all the row operations in R[i]. We denote the elements of X'[i] by $X'_{i,0}, \ldots, X'_{i,n'[i]-1}$ as above and the schedule representation then further comprises the following instruction (corresponding to the XOR_FROM_LIST instruction shown in FIG. 3):

XOR_FROM_LIST s=1 t=1 d=1 Qual=<n'[i]+1> Args=<$X'_{i,0}$><$X'_{i,1}$> ... <$X'_{i,n'[i]-1}$><$P_R[i]$>

After this third stage, all row operations have been considered that were used to reduce the matrix into upper triangular form.

In a fourth stage, then we consider a further $I_1$ steps, i.e., $I_1<=i<2I_1$. At each step, we denote by R[i] the set of all row operations performed in steps $I_1$ to i inclusive and by R'[i] the set of all row operations in R[i] such that the second argument to RowOp[ ] is $P_R[j]$ where j=$2I_1$-i. Then Let X'[i] be the set of rows, X, such that RowOp[X, $P_R[j]$, beta] is an element of R'[i]. Then, for each step, i, $I_1<=i<2I_1$, we denote the elements of X'[i] by $X_{i,0}, \ldots, X_{i,n-1}$ as above and the schedule representation further comprises the following instruction (corresponding to the XOR_FROM_LIST instruction shown in FIG. 3):

XOR_FROM_LIST s=1 t=1 d=1 Qual=<n+1>
Args=<$X_{i,0}$><$X_{i,1}$> ... <$X_{i,n-1}$><$P_R[j]$>

Advantageously, the above embodiment based on encoding and decoding using inactivations results in a greatly compressed representation of the sequence of symbol operations due to the use of the XOR_FROM_LIST instruction shown in FIG. 3 in place of many individual SYMBOL_XOR instructions shown in FIG. 2.

It should be noted that not all the instructions included in FIGS. 2 and 3 need be used in this. It should be understood that specific embodiments of an interpreter for these representations of a schedule may comprise all the instructions listed or a subset of the instructions listed sufficient to interpret schedules generated according to specific rules. On the one hand, support for the full instruction set provides the greatest generality and therefore provides the greatest flexibility to the process that is generating the schedule representation to employ optimizations based on the availability of compound or other instructions. On the other hand, support for a limited instruction set admits a simpler, more compact and potentially faster implementation of the FECvm or its equivalent which interprets the schedule representation. This is of particular value when the FECvm or its equivalent is to be implemented in hardware.

It should further be understood that a process for generating the representation of the sequence of symbol operations based on the method of representation described above may be carried out concurrently with the Gaussian elimination process or other encoding and decoding processes, including, for example, encoding and decoding using inactivations or may be carried out subsequently. For example, schedule representations can be computed off-line and permanently stored within encoding devices, and then for each source block to be encoded by an encoding device, the encoding device uses an FECvm or its equivalent to execute a stored schedule representation on each source block to be encoded.

As another example, schedule representations at receiving devices can be formed on-the-fly by the receiving device depending on which symbols are received and lost for a source block, and then an FECvm or its equivalent may be used by the receiving device to execute the schedule representation for a source block across subblocks of the source block multiple times per source block decoded (as further described below). As a third example, an execution of the schedule representation by an FECvm or its equivalent may occur concurrently with the forming of the schedule representation, for example as packets are being encoded at an encoding device or as packets are arriving and being processed for decoding at a receiving device, as for example described in Luby V.

In a further embodiment, a schedule representation is equipped with additional instructions as shown in FIG. 4 that add specific support for certain aspects of the codes described in Shokrollahi I and Shokrollahi III. It should be understood that these codes can be encoded and decoded and efficient representations of the sequence of symbol operations can be formed using only the instructions illustrated in FIGS. 2 and 3. Advantageously the further embodiment now described may result in more efficient use of storage and more computationally efficient interpretation of the schedule representation in return for including FEC-code specific methods within a FECvm or its equivalent.

As described in Shokrollahi I and Shokrollahi II, certain of the output symbols of the code may be "High Density Parity Check" codes. In specific embodiments of these codes, these High Density Parity Check codes have a construction that is obtained through multiplication of a sparse matrix H with an accumulator matrix A. The sparse matrix H has a number of rows, h, equal to the number of HDPC symbols and a number of columns, n, equal to the total number of intermediate symbols, minus h. The accumulator matrix A has n rows and n columns. Both matrices may have entries from a finite field $GF(2^q)$. Each column of the matrix H except the last may have two non-zero entries, which may be each equal to the identity of the field. The last column has zero or more entries which may be successive powers of the generator element, alpha, of the field. The accumulator matrix A is lower triangular, each column comprising, from the diagonal element downwards, successive powers of the generator element alpha, beginning with the identity.

Specific instances of such matrices are known in the art to perform well in the context of multi-stage chain reaction codes as further described and exemplified in Shokrollahi III.

In a specific embodiment, a specific schedule representation instruction is used for the efficient elimination of portions of a matrix, with the portions being constructed according to the product of the matrices H and A described above with elements taken from GF(2) (referred to herein as "HDPC rows"). This instruction may preferably be the HDPC_GF2 instruction shown in FIG. 4.

In this embodiment, the method described above for representing a sequence of symbol operations using an instruction list in the case that encoding and decoding using inactivations is used is modified as follows. Firstly, the Gaussian Elimination process is modified such that rows of the matrix which are generated according to the product of matrices of the form H and A are not chosen as pivot rows if other unprocessed rows remain. Secondly, the method of representing the sequence of symbol operations using an instruction list is modified such that during the second stage, only those rows which are not HDPC rows are processed. The remainder of the second stage is replaced by the following method: the instruction list further comprises a SYMBOL_CLEAR instruction with argument $I_1$ and a single HDPC_GF2 instruction. The arguments of the HDPC_GF2 instruction may preferably be as follows: Firstly, let I be the number of rows which are chosen by the Gaussian Elimination process as pivot rows during the second stage identified above. Let $R_0, \ldots, R_{I-1}$ be these rows, in the order in which they were processed. Let $C_0, \ldots, C_{I-1}$ be the pivot columns that were chosen in association with $R_0, \ldots, R_{I-1}$, during the Gaussian Elimination process, which are exactly the "inactive" columns.

The instruction qualifier of the HDPC_GF2 instruction indicates the number of non-zero entries, h', in the last column of the matrix H. The first argument of the HDPC_GF2 instruction indicates the number of columns which must be processed by the instruction and is set to the total number of columns $I_0$ minus the number of HDPC rows, h. The HDPC_GF2 instruction then has three arguments for each column that must be arranged in the original column ordering. Let the positions of the two non-zero entries in the ith column of the matrix H be denoted pos1(i) and pos2(i). Let p1(i) and p2(i) be the positions of the rows pos1(i) and pos2(i) respectively in the list $R_0, \ldots, R_{I-1}$. Then the first two of the three arguments corresponding to column i are given as $C_{p1(i)}$ and $C_{p2(i)}$. The third argument corresponding to column i is given as i if i is not included in $C_0, \ldots, C_{I-1}$ and by $I_1$ otherwise. The final h' arguments are as follows. Suppose that the positions of the non-zero entries of the last column of H are given by pos(0), . . . , pos(h'-1). Then let p(i) be the index of row pos(i)

in the list $R_0, \ldots, R_{l-1}$. Finally, the i-th of the last h' arguments of the HDPC_GF2 instruction is given by $C_{p(i)}$.

When processed by an FECvm or its equivalent, the above instruction results in the processing of a sequence of symbol operations that have the equivalent result to those that would have been caused by the original method representing the sequence of symbol operations. Advantageously, the method described here results in fewer symbol operations and fewer bytes of data within the instruction list.

The method of representation of the sequence of symbol operations continues with the third stage described above.

In a further specific embodiment, specific schedule representation instructions are used for the efficient elimination of portions of a matrix, the portions being constructed according to the product of the matrices H and A described above with elements taken from GF(256). This instruction may preferably be the HDPC_GF256 instruction shown in FIG. 4. It should be noted that not all implementations need include all of the efficiency improvements described herein.

Parallel Execution of Symbol Operations

According to a further embodiment, the representation of the schedule might indicate the dependencies between certain symbol operations and groups of symbol operations such that interpretation of parts of the schedule and execution of the associated symbol operations may be carried out in parallel.

The instructions described in FIG. 5 may be used for this purpose. In this embodiment, a first instruction is provided, BRANCH_PARALLEL, in which a list of start points and end points within the schedule representation are provided. Interpretation of the schedule representation may proceed in parallel from each of these start points up to the end points. This instruction may further comprise a final start point at which interpretation may continue once all the indicated branches have completed. This further starting point is known herein as a "continuation point". In a second instruction, GROUP_PARALLEL, a start point and an end point within the schedule representation is provided and interpretation of each instruction occurring between this start point and end point may be carried out in parallel. Depending, for example, on the capabilities of the interpreter in terms of parallel execution, then the instructions between the provided start and end points in the case of this second instruction may be grouped and each group executed in parallel.

According to another embodiment, there is provided a method of interpretation of the representation of the schedule in which symbol operations are performed in parallel according to instructions provided within the schedule representation.

In this embodiment, on reaching the end point of a branch of execution, as indicated in the BRANCH_PARALLEL_INSTRUCTION, the FECvm or its equivalent checks the BRANCH_PARALLEL instruction which caused the execution of the present branch. If all other branches of this instruction have also completed, then interpretation may continue from the "continuation point" indicated within that instruction.

Example Hardware Elements

FIG. 6 is a block diagram of a communications system 100 that can be used with the present invention. In communications system 100, an input file 101, or an input stream 105, is provided to an input symbol generator 110. Input symbol generator 110 generates a sequence of one or more input symbols (IS(0), IS(1), IS(2), . . . ) from the input file or stream, with each input symbol having a value and a position (denoted in FIG. 6 as a parenthesized integer). The possible values for input symbols (source symbols), i.e., its alphabet, is typically an alphabet of $2^M$ symbols, so that each input symbol codes for M bits of the input file. The value of M is generally determined by the use of communication system 100, but a general purpose system might include a symbol size input for input symbol generator 110 so that M can be varied from use to use.

The output of input symbol generator 110 is provided to an encoder 115. Encoder 115 might encode input symbols according to aspects of the present invention described herein elsewhere. Encoder 115 generates output symbols from the input symbols provided by the input symbol generator. The value of each output symbol can be determined according to the input symbols, the schedules used, and possibly other values available to the encoder. Typically, a particular output symbol's value is based on some function of one or more of the input symbols, referred to herein as the output symbol's "associated input symbols" or just its "associates", some of which can be generated according to schedules and instructions. the function might be XOR or some other suitable function.

In some embodiments, the number of input symbols is used by the encoder to select the associates. If the number is not known in advance, such as where the input is a streaming file, it can be just an estimate. The number might also be used by encoder 115 to allocate storage for input symbols.

As shown, encoder 115 provides output symbols to a transmit module 140. Transmit module 140 transmits the output symbols, and depending on the keying method used to identify each output symbol, transmit module 140 might also transmit some data about the keys of the transmitted output symbols, over a channel 145 to a receive module 150. In some cases, the key that identifies an output symbol might be entirely determined from the position of the output symbol in a transmission, in which case separate identification of keys is not required.

Channel 145 is assumed to be an erasure channel, but that is not a requirement for proper operation of communication system 100. Modules 140, 145 and 150 can be any suitable hardware components, software components, physical media, or any combination thereof, so long as transmit module 140 is adapted to transmit output symbols and any needed data about their keys to channel 145 and receive module 150 is adapted to receive symbols and potentially some data about their keys from channel 145.

As explained above, channel 145 can be a real-time channel, such as a path through the Internet or a broadcast link from a television transmitter to a television recipient or a telephone connection from one point to another, or channel 145 can be a storage channel, such as a CD-ROM, disk drive, Web site, or the like. Channel 145 might even be a combination of a real-time channel and a storage channel, such as a channel formed when one person transmits an input file from a personal computer to an Internet Service Provider (ISP) over a telephone line, the input file is stored on a Web server and is subsequently transmitted to a recipient over the Internet.

Because channel 145 is assumed to be an erasure channel, communications system 100 does not assume a one-to-one correspondence between the output symbols that exit receive module 150 and the output symbols that go into transmit module 140. In fact, where channel 145 comprises a packet network, communications system 100 might not even be able to assume that the relative order of any two or more packets is preserved in transit through channel 145. Therefore, the key of the output symbols might be determined using one or more keying scheme and not necessarily determined by the order in which the output symbols exit receive module 150.

Receive module 150 provides the output symbols to a decoder 155. Decoder 155 uses the received output symbols to recover the input symbols (again IS(0), IS(1), IS(2), . . . ). Decoder 155 provides the recovered input symbols to an input file reassembler 165, which generates a copy 170 of input file 101 or input stream 105.

In some embodiments, the encoder includes logic and storage to implement schedule-based processing as described herein. The encoder can be part of another computing system that implements virtual machines, or the encoder can itself be a virtual machine, or the encoder can include multiple virtual machines or elements thereof.

As shown in FIG. 6, encoder 115 comprises a processing unit 202 (e.g., a dedicated CPU, virtual machine, slice, software component, etc.) that performs computations. Encoder 115 is also shown including a loader 204, which in some embodiments is part of the processing unit. Loader 204 loads input symbols into an input symbol buffer 206, which is part of a larger buffer or memory that includes a buffer 208 for additional symbols and a buffer 210 for repair symbols. In some embodiments, memory does not have to be separately allocated, but is used as needed. Encoder 115 also includes schedule storage 212 for storing schedules. In some embodiments, schedule storage 212 is flash memory and in some embodiments, schedule storage 212 is logically external to encoder 115. In any case, processing unit 202 can read (and maybe write) schedule storage 212. Processing unit 202 and/or loader 204 can also read and/or write the buffers as needed. Processing unit 202 would also include an output for output symbols and loader 204 would include an input for input symbols.

In an example operation, loader 204 would load a number of input symbols into buffer 206, zero out buffer 208 and then processing unit 202 would read in a schedule from schedule storage 212 and perform operations on buffer contents according to the schedule, populating buffers 208 and 210. In some embodiments, buffer 206 is sized to contain the input symbols loaded in, buffer 208 is sized to contain additional storage, and buffer 210 is sized to contain repair symbols generated by processing unit 202. Processing unit 202 can then output the output symbols from the buffers.

Interpretation of the Schedule

In a further embodiment, a sequence of instructions is used to direct the processing of a sequence of symbol operations. These instructions may comprise those described in FIGS. 2, 3, 4 and 5 or subsets thereof.

In a specific embodiment, the method of interpreting the sequence of instructions is carried out by a software program. In another specific embodiment, the method is carried out by hardware logic.

There may be specialized hardware or software logic to further speed up execution of some of the instructions in the instruction list. For example, there are specialized instruction codes that use registers in some machines that perform XOR logic especially efficiently, e.g., SSE instructions within an X86 architecture, so a FECvm may be designed to take advantage of those specialized instructions when executing a schedule representation. As another example, specialized hardware may be designed, e.g., within an ASIC, for performing some of the instructions within a schedule representation. For example, specialized hardware for performing finite field multiplications may be utilized by a FECvm, or very specialized hardware for performing multiplication by a particular finite field element may be advantageous when multiplication by that finite field element is common with schedule representations for an FEC code, e.g., some of the FEC codes described in Shokrollahi III.

Alternative Encoding and Decoding Using Inactivation Processes

In an alternative embodiment, a sequence of symbol operations is determined for the fourth stage of the process described above in association with the method of encoding and decoding using inactivations.

Let I be the number of "inactive" columns and let t be a non-zero integer. Note that $I=I_1-I_0$. In a preferred embodiment, $t=8$. A further ceil(I/t) symbols of storage are assumed to be available. The method then comprises the following steps:

(i) as described above, the fourth stage of the method of encoding and decoding using inactivations begins when the matrix has been reduced to upper triangular form and proceeds by use of row operations to transform the matrix to the identity. The alternative method for this fourth stage begins as described above for i from $I_1$ to $2I_1-I_0-1$ inclusive, thereby reducing the matrix formed by the intersection of the inactive columns and their respective pivot rows to the identity.

(ii) for each inactive column, identify the row that was chosen as pivot row in the step in which that column was chosen as pivot column. We shall refer to these rows as "inactive rows".

(iii) the inactive rows are formed into ceil(I/t) non-empty groups. Preferably, all but at most one group has size t.

(iv) for each group, calculate the bitwise exclusive OR of the symbols associated with rows in the group and store the result.

(v) for i from $2I_1-I_0$ to $2I_1-1$ inclusive, then as above, denote by R[i] the set of all row operations performed in steps $I_i$ to i inclusive of the Gaussian Elimination process and by R'[i] the set of all row operations in R[i] such that the second argument to RowOp[ ] is $P_R[j]$ where $j=2I_1-i$. Then Let X'[i] be the set of rows, X, such that RowOp[X, $P_R[j]$, beta] is an element of R'[i]. Then, for each step, i, $I_1<=i<2I_1$, we denote the elements of X'[i] by $X_{i,0}, \ldots, X_{i,n-1}$ as above. For each group of inactive rows identified above, a count is made of the number of members of the group that occur within X'[i]. If this count is less than t/2, then the symbol operations associated with the row operations in R'[j] are performed. If this count is greater than t/2, then the symbol associated with the group, and calculated above, is exclusive ORed with the symbol associated with row $P_R[j]$ and then symbol operations associated with the row operations RowOp[X, $P_R[j]$, beta] for all X within the group but not in R'[j] are performed. Where the count is exactly t/2, a similar operation can be performed.

In a further alternative embodiment of the invention described herein, there is provided an alternative method of determining a sequence of symbol operations for the fourth stage of the process described above in association with the method of encoding and decoding using inactivations.

The method comprises the following steps:
the fourth stage begins as described above for i from $I_1$ to $2I_1-I_0-1$ inclusive
the symbol operations performed during the first stage described above are performed again in reverse order
the symbol operations performed during the first stage described above are performed again in the original order with the following modification:
at each step, i, for each non-zero element in the pivot row $P_R[i]$ whose column C, was unprocessed at that stage of the Gaussian Elimination process, obtain the symbol associated with the row which was the pivot row in the step in which C was the pivot column and exclusive OR this symbol into the symbol associated with row $P_R[i]$.

In another embodiment, the two above methods above are combined, such that for each row the method which uses the fewest symbol operations is used.

In a further embodiment, the alternative encoding and decoding using inactivations mechanisms described above may be used in conjunction with the methods described herein for representation of the sequence of symbol operations. Furthermore, in this embodiment, the sequence of instructions that instruct the processing of the symbol operations of the first stage of encoding and decoding using inactivations, but in reverse order, are indicated as being independent of all other symbol operations following the completion of the second stage and preceding the continuation of the fourth stage and can thus be processed in parallel.

In a further alternative embodiment of the invention described herein, there is provided an alternative method (referred to herein as "optimized non-in-place processing") of determining a sequence of symbol operations for the fourth stage of the process described above in association with the method of encoding and decoding using inactivations. This method is applicable in the case where the original symbol values remain available throughout the entire encoding and decoding using inactivations process. The method comprises the following steps:

the fourth stage proceeds as described above for i from $I_1$ to $2I_1 - I_0 - 1$ inclusive the symbols associated with rows processed during the first stage are restored to their original values the symbol operations performed during the first stage described above are performed again in the original order with the following modification:

at each step, i, for each non-zero element in the pivot row $P_R[i]$ whose column C, was in the unprocessed region of the matrix at that stage of the Gaussian Elimination process, obtain the symbol associated with the row which was the pivot row in the step in which C was the pivot column and exclusive OR this symbol into the symbol associated with row $P_R[i]$.

It should be noted that the alternative procedures described above are applicable to the general case of encoding and decoding using inactivations method whether or not a specific representation of the sequence of symbol operations is used.

Encoding or Decoding by Sub-Blocks

As described previously, in many scenarios more than one storage device is available for data, each storage device having different properties in terms of speed and storage capacity. It is often desirable to perform an encoding or decoding operation on a block of data which is larger than the amount of storage available in the fastest storage device and for this reason data is often segmented into subblocks. A subblock might comprise a stripe of subsymbols of the symbols of a block, wherein each subblock is small enough to fit into fast data storage and such that the sequence of symbol operations to be performed on each subblock is the same.

Advantageously, the methods described herein may be applied in order to minimize repetition of procedures used to determine the sequence of symbol operations to be performed and thus reduce the computational complexity of the encoding or decoding process.

In a specific embodiment, the method above of representing a sequence of symbol operations (schedule representation) is applied in combination with a method of segmenting a block into subblocks.

The methods described above for representation of the schedule advantageously incur a very low overhead when the number of subblocks is increased. This is because the method has been specifically designed to ensure that execution of a schedule representation uses minimal interpretation logic that would be repeated for each block.

In a further specific embodiment, the methods above are further combined with the following method for introducing concurrency into the transfer of subblocks between volatile or non-volatile storage devices and the processing of the symbol operations, this method comprising the following steps:

(1) subblocks are formed which are sufficiently small that two complete subblocks can be contained within the fast storage device;

(2) the first subblock of data is transferred from slow to fast storage;

(3) a schedule representation is processed with respect to the first subblock of data;

(4) concurrently with step (3), the next subblock of data is transferred from slow to fast storage;

(5) a schedule representation is processed with respect to this next subblock of data;

(6) concurrently with step (5), the result of processing the previous subblock of data (which has now been processed) is transferred from fast to slow storage;

(7) subsequent to step (6), but still concurrently with step (5), the next subblock of data (if any) is transferred from slow to fast memory;

(8) if data is available in fast memory that needs processing, go to step (5).

As one skilled in the art will recognize upon review of this disclosure, there are many variants of the above processes. For example, multiple subblocks may be processed concurrently, potentially using different hardware or software processes, using the same, different or a mix of same and different schedules for different subblocks.

In a further embodiment, the data to be processed is segmented into subblocks sufficiently small that the original values the subblocks plus the current value of the subblock as it is processed can fit into the fast storage device and the method of "optimized non-in-place processing" is applied as follows:

(1) the subblock of subsymbols is read into fast memory;

(2) a schedule representation according to the method of "optimized non-in-place processing" is processed on the subsymbols of the subblock;

(3) the resulting subsymbols are written back to slow memory.

The method above can be applied whether or not there is sufficient slow storage available for both the original and processed data and thus provides for the advantages of improved computational efficiency that are apparent in the case of "optimized non-in-place processing" with the advantages in terms of slow memory usage that are apparent in the case that "optimized non-in-place processing" is not used, specifically the advantage that only an amount of slow memory sufficient to hold the intermediate symbols is required.

In a further embodiment, the methods above for concurrent processing and moving of data between storage devices and the method of efficient processing using "optimized non-in-place processing" are combined. The method comprises the following steps:

(1) subblocks are formed which are sufficiently small that three complete subblocks can be contained within the fast storage device;

(2) the first subblock of data is transferred from slow to fast storage;

(3) a schedule representation according to the method of "optimized non-in-place processing" is processed with respect to the first subblock of data, resulting in a second block of fast memory being used for storing the result of processing the schedule representation on the subblock of data;

(4) concurrently with step (3), the next subblock of data is transferred from slow storage to a third memory block within fast storage;

(5) subsequent to steps (3) and (4) a schedule representation according to the method of "optimized non-in-place processing" is processed with respect to this next subblock of data, overwriting the original data of the previous subblock with the result of the schedule representation processing;

(6) concurrently with step (5), the result of schedule representation processing of the previous subblock of data is transferred from fast to slow storage;

(7) subsequently to step (6), but still concurrently with step (5), the next subblock of data (if any) is transferred from slow to fast memory;

(8) if data is available in fast memory which needs processing, go to step (5).

Explicit Cache Optimization of Express Schedules

In some cases, an express schedule could be modified using an off-line or online optimization process to produce an equivalent schedule that took explicit advantage of on-chip memory to reduce memory access and therefore improve processing speed.

One Direct Memory Access ("DMA") approach involves "striping", wherein an encoder or decoder processes a source block in stripes, i.e., the i-th stripe comprising the i-th group of T' bytes from each symbol, where T' is some number less than or equal to the number of bytes in a symbol (this also works with units other than bytes). If T' is less than the symbol size, the express schedule is executed separately for each stripe.

This DMA approach results in a memory access requirement of one symbol read per source symbol and one symbol write per repair symbol (in the encoding case) or missing source symbol (in the decoding case). The memory bandwidth required is therefore not much greater than the actual encode/decode rate. This typically uses the least possible memory bandwidth.

Explicit optimization of the express schedule admits another approach, in which on-chip memory is used to store whole symbols that are due to be re-used later in the schedule. Input parameters to an optimization process might specify the amount of available on-chip memory so that it can vary, and explicit express schedule instructions might be provided for access to this memory block. The optimization process would then determine a new schedule that takes advantage of this on-chip memory to reduce memory access during actual symbol processing.

The DMA approach can be expected to require less memory access requirement than explicit optimization, but the optimization can be expected to reduce processor logic, since it does not require multiple passes through the express schedule.

This optimized schedule could be combined with the DMA approach to tune the memory access requirements so that maximum use is made of the memory bandwidth. For example, it may be that using DMA alone reduces the memory access requirements to the extent that the CPU is now the main factor influencing execution speed. Optimized schedules combined with DMA could reduce the CPU requirements at the cost of additional memory access.

Methods are provided below for providing online versions of this approach that can generate an optimized express schedule on-the-fly.

Off-Line Optimization Techniques

A basic technique is to consider the on-chip memory as a kind of cache and apply standard cache algorithms to determine which symbols to store on-chip and which to move off-chip. For example, whenever a "store" instruction is encountered, instead store the symbol that has been in the cache the longest and thereby free a space for the newly calculated symbol. Whenever a symbol that is in the cache is required, it is retrieved from there instead of from memory. The express schedule instructions would explicitly reference locations in this "cache" memory where needed (this implies extension of the instruction language).

However, even more improvement is possible. In the basic technique, the decision of how to use a cache space only depends on things that have happened in the past. However, with off-line optimization, what will happen in the future is also known.

As above, when a store instruction is encountered and the cache is full, which symbol to flush from the cache and into memory needs to be determined. A good metric would be the "next access time" for the symbol—i.e., the position in the time sequence where the current value next used in the schedule. The symbol with the latest "next access time" would be flushed (and this may in fact be the symbol that was about to be stored).

Clearly, symbols whose current value is not used again will be flushed first (and indeed need not be written to actual memory unless they are repair or missing source symbols). This includes symbols whose final value has been calculated and used wherever needed and also symbols whose value is to be overwritten (for example for non-inplace decoding where the recovered symbols are restored to their original values during back-substitution).

If there are no such symbols, then whichever symbol is flushed will have to be read back again later. This requirement for an additional read is the same whichever symbol is flushed. Flushing the symbol with the latest "next access time" makes available the largest amount of resource (in terms of memory×time) and thus should minimize the number of subsequent flushes required.

There are several optimization techniques which make use of additional memory to calculate intermediate values which are then used in multiple calculations (for example, pre-computation for back-substitution, storage of intermediate symbols during in-place recovery of the source block from the intermediate block). The above off-line optimization can be combined with these techniques to produce express schedules that take advantage of those techniques without actually requiring additional memory in main store. This can be done using a two-step process first by calculating an express schedule assuming availability of additional memory in main store and second by carrying out an off-line optimization process as described above. During this latter process, if a symbol from the additional memory over and above the intermediate block (call this a temporary symbol) is selected to be flushed from cache—and this symbol is needed again—then an intermediate symbol that is in the cache is selected and the temporary symbol is stored in the main memory location allocated to that intermediate symbol. This intermediate symbol is then blocked from being flushed from the cache until the point that the temporary symbol is needed again. Ideally, the intermediate symbol selected should be one which would not be selected to be flushed from cache anyway—such a symbol could be identified by explicit look-ahead or a heuristic (such as the symbol with the earliest next access time). If no such symbol exists, the temporary symbol is blocked from being flushed and another symbol has to be flushed from cache instead.

On-Line Optimization Techniques

The scope for on-line optimization—for example when an express schedule is built at the decoder—can be limited by the need to generate the express schedule quickly and without consuming significant amounts of additional memory. In such cases, it might not make sense to look ahead to determine when a given symbol will be reused.

To follow a "cache" algorithm such as described above requires at least that tables of cache contents be created and maintained (e.g., a table of the location in cache of each intermediate symbol plus a table of the contents of each cache symbol). The memory used for the pointers within an array of output symbols could be used for that. This may not be a significant overhead, but determining which symbol to flush may be more difficult to do quickly. The following are some heuristics that might be used in example encoders/decoders. In one variation, during a process for encoding or decoding chain reaction code symbols, the cache can be treated as FIFO—then at least one symbol at each stage will be available in cache (specifically the symbol that releases the currently considered symbol). In another variation, after a chain reaction encoding or decoding process, inactive symbols are kept in cache as much as possible. If there is not enough cache for all the inactive symbols, then the ones that were inactivated first should be preferred.

The above described processes can be performed using hardware, software or some combination.

As has now been described, symbol encoding/decoding schedules are provided. The schedules might comprise lower level instructions, providing a practical speed up for encoding/decoding. The process might be done by hardware logic that matches the lower level notion of the schedule as described herein. The instructions can be performed by virtual machines, hardware circuits (e.g., FPGA, etc.) or the like. The processor might include cache memory and some general purpose CPU, an ASIC or the like. Such devices might include a special register that is loaded and stores the current operation that is to be performed, and that drives the execution of that symbol operation. The virtual machine might be a software program that interprets the virtual machine language.

In a particular set of instructions, they are explicit with little or no other logic involved, wherein each instruction is based on symbols, where the length of a symbol can vary, i.e., the same schedule representation can be used for symbols of four bytes or for symbols of 1000 bytes. The set of low level instructions operates on symbols for the purpose of encoding and decoding FEC codes. Preferably, the low level instructions include no branching or arithmetic or additional logic needed to execute the schedule, but a sequence is simply a list of symbol operations that represent an FEC encoding or FEC decoding.

Examples of Schedules

The attached appendices provide examples of values that might be used in generating schedules.

Appendix A comprises 30 individual appendices, namely an appendix listing a sequence of "pre-coding" values for a given block size, followed by an appendix listing a sequence of "repair symbol encoding" values for that given block size section, in turn followed by those two appendices for other block sizes. These sequences (one for each of 15 values of K, supporting source blocks with source symbols ranging up to 1281 source symbols) might be used with an FEC encoder that encodes according to variations of multi-stage chain reaction codes, such as those described in Shokrollahi I.

The use and meaning of the numbers shown in Appendix 1 will now be described. For a pair of appendices for a given block size, K, there is a pre-coding sequence and a repair symbol encoding sequence (collectively "the encoding sequence") that together define explicit encoding operation sequences that are applied to generate repair symbols from source symbols.

In this specific example, there is a maximum block size and it is one of the following values:
K=101, 120, 148, 164, 212, 237, 297, 371, 450, 560, 680, 842, 1031, 1139, or 1281.

An encoder using one of the encoding sequences would typically have the data to be encoded stored in a block of memory wherein each memory location stores a complete symbol. The memory can be virtual memory. Thus, at the start of an encoding process, the source symbols can be assumed to be stored consecutively in memory locations 0 to K−1 inclusive.

Additional working memory locations can be required to be available. In some embodiments, the additional working memory depends on K (and possibly also the encoding sequence), but in one embodiment, for block sizes of {101, 120, 148, 164, 212, 237, 297, 371, 450, 560, 680, 842, 1031, 1139, 1281} the total memory to be allocated (for the block plus the corresponding additional working memory) might be {127, 149, 181, 197, 251, 277, 337, 419, 499, 613, 739, 907, 1103, 1213, 1361}, respectively. The encoder might assume that the additional working memory is initialized to zero, in which case that should happen.

Each line of a "pre-coding" sequence comprises a series of memory location indices (in decimal notation), separated by spaces and each optionally preceded by the character ">". Because line breaks may change from page to page, the actual line endings are denoted by "\n" and it should be understood that printed lines not ending with "\n" are merely parts of lines that are too large to be printed on a single line.

The ">" character signals a treatment of the value following the character differently than a value that is not preceded by that character. An encoder might perform the following operations on each line from the pre-coding sequence in the order the lines appear:

```
A := 0
FOR i = 0 to n−1
    IF mi is preceded by ">" THEN
        C[mi] := C[mi] ⊕ A
    ELSE
        A := A ⊕ C[mi]
ENDIF
```

In the above pseudocode, A refers to a working register that stores one symbol, n is the number of memory location entries on the line, mi is the i-th entry of the line, for i=0, . . . , n−1, C[x] is the symbol at memory location x, 0 is the zero symbol (e.g., all bits are zero) and the operation "⊕" is the bitwise exclusive OR operation.

Each line of a repair symbol encoding sequence lists the memory locations that are to be XORed together to produce a repair symbol, the first line providing the list for the repair symbol with ESI K, the second for the repair symbol with ESI K+1, etc.

For example, suppose the following line were encountered by the encoder within a pre-coding sequence:
4 8 3 5>7 6>10

The encoder would then generate the following symbol assignments:

C[7]:=C[7] ⊕ C[4] ⊕C[8] ⊕ C[3] ⊕ C[5]
C[10]:=C[10] ⊕ C[6] ⊕ C[4] ⊕ C[8] ⊕ C[3] ⊕C[5]

Appendix B illustrates another example, albeit in a different format. Appendix B is formatted as a header file with constant assignments that correspond to sequences for a hybrid encoder schedule. The format of a schedule item is: XorFunctionType (4-bit), Offset (12-bit), NeighborList[1] (16-bit), NeighborList[2] (16-bit), . . . , NeighborList[N] (16-bit). Unless otherwise specified, "symbol at location Z" refers to the Z-th symbol at the source block. Prior to operations, the padding/LDPC/HDPC part of block is cleared (e.g., filled with zeros). In addition, one symbol worth of memory next to it is also cleared (i.e., an additional zero-symbol is constructed).

Examples of values for XorFunctionType include:

| | |
|---|---|
| XorFunctionType: | XOR_FROM_NEIGHBORS |
| Offset: | Value of N |
| Operations: | Load symbol from location NeighborList[1] into accumulator |
| | Xor with symbols at locations NeighborList[2, ..., N−1] into accumulator |
| | Store the accumulator symbol to location NeighbotList[N] |
| Notes: | Used for symbol recovery and back-substitution |
| XorFunctionType: | XOR_FROM_NEIGHBORS_LOOP1 |
| Offset: | Not used (N is fixed at 3) |
| Operations: | Same as XOR_FROM_NEIGHBORS, with fixed N value of 3 |
| Notes: | Corresponding to weight of 1 |
| XorFunctionType: | XOR_FROM_NEIGHBORS_LOOP2 |
| Offset: | Not used (N is fixed at 4) |
| Operations: | Same as XOR_FROM_NEIGHBORS, with fixed N value of 4 |
| Notes: | Corresponding to weight of 2 |
| XorFunctionType: | XOR_FROM_NEIGHBORS_LOOP3 |
| Offset: | Not used (N is fixed at 5) |
| Operations: | Same as XOR_FROM_NEIGHBORS, with fixed N value of 5 |
| Notes: | Corresponding to weight of 3 |
| XorFunctionType: | GF256_HDPC |
| Offset: | Denote it as X |
| Operations: | Load symbol from location NeighborList[1] |
| | Loop (nSrcSymbols + nLDPC) times: |
| | 1) Xor accumulator symbol into next location in NeighborList |
| | 2) Xor accumulator symbol into next location in NeighborList |
| | 3) Multiply accumulator with alpha |
| | 4) Xor with symbol at next NeighborList location into accumulator |
| | Loop nHDPC times: |
| | 1) Xor accumulator symbol into next location in NeighborList |
| | 2) Multiply accumulator with alpha |
| | Loop X times (X is the 12-bit offset value): |
| | 1) Load symbol from next location in NeighborList into accumulator |
| | 2) Xor accumulator symbol into next location in NeighborList |
| Notes: | For generating HDPC symbols |
| XorFunctionType: | GAUSSIAN_ELIMINATION |
| Offset: | Not used |
| Operations: | Loop nHDPC times (loop counter j decreases from nHDPC−1 to 0): |
| | 1) Load symbol from next location in NeighborList into accumulator |
| | 2) Loop j times, each time multiply next number in NeighborList (as field element) with symbol at next NeighborList location, then add to the accumulator |
| | 3) Store the accumulator symbol into next location in NeightborList |
| | Loop nHDPC times (loop counter j decreases from nHDPC−1 to 0): |
| | 1) Multiply next number in NeighbofList (as field element) with the symbol at next NeighborList location, then load into the accumulator |
| | 2) Loop j times, each time multiply next number in NeighborList (as field element) with symbol at next NeighborList location, then add to the accumulator |
| | 3) Store the accumulator symbol into next location in NeightborList |
| Notes: | Forward pass and backward pass |
| XorFunctionType: | XOR_REPAIR_START |
| Offset: | Not used |
| Operations: | None |
| Notes: | Signals the beginning of repair generation instruction portion |
| XorFunctionType: | XOR_REPAIR |
| Offset: | Value of N |
| Operations: | Load symbol from location NeighborList[1] |
| | XOR with symbols at locations NeighborList[2, ..., N−1] into accumulator |
| | Store the accumulator symbol into location NeighbotList[N] at repair block |
| Notes: | Generates repair symbols |
| XorFunctionType: | XOR_STOP |
| Operations: | None |
| Notes: | Signals the end of entire instruction set |

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. An apparatus configured to interpret a representation of a sequence of symbol operations, the apparatus comprising:
   logic for interpreting a list of instructions to process the symbol operations on a data block, wherein the list of instructions comprises generic instructions for performing symbol operations, wherein at least some of the instructions define FEC-specific instructions, wherein each of a plurality of output symbols is associated with one or more source symbols, wherein the number of source symbols associated with an output symbol is the output symbol's degree, wherein an instruction set of a schedule representation comprises instructions including an instruction for selecting an active source symbol that is associated with an output symbol of degree two or higher and instructions for deactivating the selected source symbol that is associated with the output symbol of degree two or higher.

2. The apparatus of claim 1, wherein the instruction set of a schedule representation comprises instructions specific to multi-stage chain reaction codes.

3. The apparatus of claim 1, wherein the instruction set of a schedule representation comprises instructions specific to multi-field multi-stage chain reaction codes.

4. The apparatus of claim 1, wherein the instruction set of a schedule representation does not include instructions for performing operations that are not symbol operations or for the execution of loops or conditional statements.

5. The apparatus of claim 1, wherein the instruction set of a schedule representation includes instructions for performing operations that are not symbol operations or for the execution of loops or conditional statements.

6. An apparatus configured to construct a representation of a sequence of symbol operations, the apparatus comprising:
   logic for determining the sequence of symbol operations that are to be used to perform at least some part of FEC encoding or decoding processing;
   logic for forming groups of such operations such that each group, comprising one or more symbol operations, can be represented by a single schedule representation instruction; and
   logic for forming a list of such instructions for use as the representation;

wherein an instruction set of a schedule representation comprises generic instructions for performing symbol operations, wherein at least some of the instructions in the instruction set define FEC-specific instructions, wherein each of a plurality of output symbols is associated with one or more source symbols, wherein the number of source symbols associated with an output symbol is the output symbol's degree, wherein the instruction set of a schedule representation comprises instructions including an instruction for selecting an active source symbol that is associated with an output symbol of degree two or higher and instructions for deactivating the selected source symbol that is associated with the output symbol of degree two or higher.

7. The apparatus of claim 6, wherein the instruction set of a schedule representation comprises instructions specific to multi-stage chain reaction codes.

8. The apparatus of claim 6, wherein the instruction set of a schedule representation comprises instructions specific to multi-field multi-stage chain reaction codes.

9. The apparatus of claim 6, wherein the instruction set of a schedule representation does not include instructions for performing operations that are not symbol operations or for the execution of loops or conditional statements.

10. The apparatus of claim 6, wherein the instruction set of a schedule representation includes instructions for performing operations that are not symbol operations or for the execution of loops or conditional statements.

11. The apparatus of claim 6, further comprising:
logic for determining at least one subset of the instructions the result of which is independent of at least one other subset of the instructions; and
logic for including an indication within the instruction list that the two identified subsets of instructions may be processed in parallel.

12. An apparatus configured to encode or decode forward error correction codes by means of inactivation, the apparatus comprising:
logic for associating each of a plurality of output symbols with one or more source symbols, wherein a number of source symbols associated with an output symbol is the output symbol's degree;
logic for providing an instruction set of a schedule representation comprising instructions including an instruction for selecting an active source symbol that is associated with an output symbol of degree two or higher and instructions for deactivating the selected source symbol that is associated with the output symbol of degree two or higher, wherein at least some of the instructions in the instruction set define FEC-specific instructions;
logic for retaining an original value of at least one of the symbols to be processed during the initial stages of processing;
logic for calculating a value of at least one of the inactive symbols; and
logic for repeating at least one of the previously processed symbol operations using the original value of at least one of the symbols and the calculated value of at least one of the inactive symbols.

13. An apparatus configured to encode or decode forward error correction codes by means of inactivation, the apparatus comprising:
logic for associating each of a plurality of output symbols with one or more source symbols, wherein a number of source symbols associated with an output symbol is the output symbol's degree;
logic for providing an instruction set of a schedule representation comprising instructions including an instruction for selecting an active source symbol that is associated with an output symbol of degree two or higher and instructions for deactivating the selected source symbol that is associated with the output symbol of degree two or higher, wherein at least some of the instructions in the instruction set define FEC-specific instructions;
logic for calculating a value of at least one inactive symbol;
logic for reconstructing a value of at least one original symbol; and
logic for repeating at least one of the previously processed symbol operations using the reconstructed original value of at least one of the symbols and the calculated value of at least one of the inactive symbols.

14. An apparatus configured to encode or decode forward error correction codes by means of inactivation, the apparatus comprising:
logic for associating each of a plurality of output symbols with one or more source symbols, wherein a number of source symbols associated with an output symbol is the output symbol's degree;
logic for providing an instruction set of a schedule representation comprising instructions including an instruction for selecting an active source symbol that is associated with an output symbol of degree two or higher and instructions for deactivating the selected source symbol that is associated with the output symbol of degree two or higher, wherein at least some of the instructions in the instruction set define FEC-specific instructions;
logic for calculating a value of at least three of the inactive symbols;
logic for calculating a value of the sum of at least one set of at least three of the inactive symbols;
logic for identifying at least one symbol to which more than half of the inactive symbols from at least one of the sets are to be added;
logic for identifying the remaining inactive symbols from the identified set;
logic for adding these remaining inactive symbols to the identified symbol; and
logic for adding the previously calculated sum of the set of inactive symbols to the identified symbol.

* * * * *